US009093279B2

(12) United States Patent
Nakajima et al.

(10) Patent No.: US 9,093,279 B2
(45) Date of Patent: Jul. 28, 2015

(54) THIN FILM FORMING COMPOSITION FOR LITHOGRAPHY CONTAINING TITANIUM AND SILICON

(75) Inventors: Makoto Nakajima, Toyama (JP); Yuta Kanno, Toyama (JP); Satoshi Takeda, Toyama (JP); Yasushi Sakaida, Toyama (JP); Shuhei Shigaki, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/131,945

(22) PCT Filed: Jul. 20, 2012

(86) PCT No.: PCT/JP2012/068479
§ 371 (c)(1),
(2), (4) Date: Jan. 10, 2014

(87) PCT Pub. No.: WO2013/012068
PCT Pub. Date: Jan. 24, 2013

(65) Prior Publication Data
US 2014/0120730 A1    May 1, 2014

(30) Foreign Application Priority Data

Jul. 20, 2011    (JP) ................................. 2011-159138
Apr. 11, 2012    (JP) ................................. 2012-090429

(51) Int. Cl.
*G03F 7/26*    (2006.01)
*H01L 21/033*    (2006.01)
(Continued)

(52) U.S. Cl.
CPC .......... *H01L 21/0332* (2013.01); *G03F 7/0752* (2013.01); *G03F 7/091* (2013.01); *G03F 7/094* (2013.01); *G03F 7/40* (2013.01); *H01L 21/31111* (2013.01); *H01L 21/31138* (2013.01)

(58) Field of Classification Search
CPC ............... H01L 21/02565; H01L 2224/05166; H01L 2924/10253; H01L 2924/01022; H01L 2924/04941; H01L 21/32139; G03F 7/0035; G03F 7/40
USPC .......................................... 430/311, 313, 330
See application file for complete search history.

(56) References Cited

U.S. PATENT DOCUMENTS
2009/0286188 A1    11/2009   Hatakeyama et al.
2013/0005150 A1*   1/2013    Ogihara et al. ............... 438/694

FOREIGN PATENT DOCUMENTS
EP          1 798 599 A1    6/2007
JP          A-11-258813      9/1999
(Continued)

OTHER PUBLICATIONS
Aug. 14, 2012 International Search Report issued in International Application No. PCT/JP2012/068479.
(Continued)

*Primary Examiner* — Caleen Sullivan
(74) *Attorney, Agent, or Firm* — Oliff PLC

(57) ABSTRACT

A thin film forming composition for forming resist underlayer film useable in the production of a semiconductor device, and a resist upper layer film absorbs undesirable UV light with a thin film as an upper layer of the EUV resist before undesirable UV light reaches the EUV resist layer in EUV lithography, an underlayer film (hardmask) for an EUV resist, a reverse material, and an underlayer film for a resist for solvent development. The thin film forming composition useable together with a resist in a lithography process, comprising a mixture of titanium compound (A) selected from:

$$R^0_a Ti(R^1)_{(4-a)}$$    Formula (1)

a titanium chelate compound, and a hydrolyzable titanium dimer, and a silicon compound (B):

$$R^2_a R^3_b Si(R^4)_{4-(a'+b)}$$    Formula (2)

a hydrolysis product, or a hydrolysis-condensation product of the mixture, wherein the number of moles of Ti atom is 50% to 90% relative to the total moles in terms of Ti atom and Si atoms in the composition.

18 Claims, 1 Drawing Sheet

(51) Int. Cl.
*G03F 7/40* (2006.01)
*H01L 21/311* (2006.01)
*G03F 7/075* (2006.01)
*G03F 7/09* (2006.01)

(56) References Cited

FOREIGN PATENT DOCUMENTS

| JP | A-2004-348133 | 12/2004 |
| JP | A-2006-317864 | 11/2006 |
| JP | A-2007-163846 | 6/2007 |
| JP | A-2008-198788 | 8/2008 |
| JP | A-2009-301007 | 12/2009 |
| WO | WO 2005/081065 A1 | 9/2005 |

OTHER PUBLICATIONS

English Translation of Aug. 14, 2012 Written Opinion issued in International Application No. PCT/JP2012/068479.

Oct. 29, 2014 Search Report issued in European Application No. 12815272.5.

\* cited by examiner

THIN FILM FORMING COMPOSITION FOR LITHOGRAPHY CONTAINING TITANIUM AND SILICON

TECHNICAL FIELD

The present invention relates to a composition for forming an underlayer film between a substrate and a resist (for example, a photoresist, an electron beam resist, and an EUV resist) that are used in the production of semiconductor devices.

The present invention relates to also a composition for forming a thin film coated as an upper layer of an EUV resist for absorbing out-of-band wavelength light of EUV.

BACKGROUND ART

Conventionally, in the production of semiconductor devices, fine processing by lithography using a photoresist has been performed. The fine processing is a processing method for forming fine convexo-concave shapes corresponding to the following pattern on the surface of a substrate by: forming a thin film of a photoresist on a semiconductor substrate such as a silicon wafer; irradiating the resultant thin film with an active ray such as an ultraviolet ray through a mask pattern in which a pattern of a semiconductor device is depicted, developing the film; and subjecting the substrate to etching processing using the resultant photoresist pattern as a protecting film. Recently, however, the high integration of semiconductor devices has progressed and the adopted active ray tends to have a shorter wavelength, such as an ArF excimer laser (193 nm) replacing a KrF excimer laser (248 nm). Following such a tendency, the influence of reflection of an active ray on a semiconductor substrate has been a large issue.

As an underlayer film between the semiconductor substrate and the photoresist, the use of a film known as a hardmask containing a metal element such as silicon and titanium (see, for example Patent Document 1 and Patent Document 2) is performed. In this case, the resist and the hardmask have components largely different from each other, so that the removal rates of the resist and the hardmask by dry etching largely depend on the type of a gas used for dry etching. Then, by appropriately selecting the type of a gas, the hardmask can be removed by dry etching without a large decrease in the film thickness of the photoresist.

Thus, in the production of semiconductor devices in recent years, for achieving various effects such as the reflection preventing effect, a resist underlayer film has become disposed between the semiconductor substrate and the photoresist. Then, also until today, studies of a composition for a resist underlayer film have been performed, however, due to the diversity of characteristics required for the composition and so on, the development of a novel material for the resist underlayer film is desired.

As an EUV lithography method, there is disclosed a method for containing a polymer containing a group including one or more of beryllium, boron, carbon, silicon, zirconium, niobium, and molybdenum in an upper layer of an EUV resist for protecting the EUV resist from pollutant substances or for blocking an undesirable radiation such as UV and DUV (Patent Document 3 and Patent Document 4).

PRIOR ART DOCUMENTS

Patent Documents

Patent Document 1: Japanese Patent Application Publication No. H11-258813 (JP 11-258813 A)
Patent Document 2: Japanese Patent Application Publication No. 2007-163846 (JP 2007-163846 A)
Patent Document 3: Japanese Patent Application Publication No. 2004-348133 (JP 2004-348133 A)
Patent Document 4: Japanese Patent Application Publication No. 2008-198788 (JP 2008-198788 A)

SUMMARY OF THE INVENTION

Problems to be Solved by the Invention

It is an object of the present invention to provide a thin film forming composition which is capable of being used in the production of a semiconductor device, and is used together with a resist (a photoresist, an electron beam resist, and an EUV resist) in a lithography process. More in detail, it is an object of the present invention to provide a resist underlayer film forming composition for lithography for forming a resist underlayer film capable of being used as a hardmask. In addition, it is an object of the present invention to provide a resist underlayer film forming composition for lithography for forming a resist underlayer film capable of being used as an anti-reflective coating. Further, it is an object of the present invention to provide a resist underlayer film for lithography causing no intermixing with a resist and having a dry etching rate higher than that of the resist, and a resist underlayer film forming composition for forming the underlayer film.

It is an object of the present invention to provide an EUV resist upper layer film forming composition for suppressing lowering of the sensitivity of an EUV resist or degradation of a pattern shape due to light of wavelengths of, for example, 190 to 300 nm, 190 to 250 nm, particularly around 200 to 240 nm by efficiently absorbing undesirable UV light with a thin film existing as an upper layer of the EUV resist before the undesirable UV light reaches the EUV resist layer in EUV lithography. It is also an object of the present invention to provide an underlayer film (hardmask) for an EUV resist as a thin film existing as an underlayer of the EUV resist, or an underlayer film forming composition for a resist for solvent development. It is further an object of the present invention to provide a reverse material.

That is, the present invention provides a thin film forming composition utilizable for a resist underlayer film forming composition for a photoresist and the like, a resist underlayer film forming composition for an EUV resist and the like, an EUV resist upper layer film forming composition, a reverse material forming composition, an underlayer film forming composition for a resist for solvent development, and the like.

Means for Solving the Problem

The present invention is, according to a first aspect, a thin film forming composition that is used together with a resist in a lithography process, comprising a mixture of a titanium compound (A) selected from a group consisting of a compound of Formula (1):

   Formula (1)

[in Formula (1), $R^0$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group and is bonded to a titanium atom through a Ti—C bond; $R^1$ is an alkoxy group, an acyloxy group, or a halogen atom; and a is an integer of 0 to 2], a titanium chelate compound, and a hydrolyzable titanium dimer, and a silicon compound (B) of Formula (2):

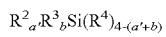  Formula (2)

[in Formula (2), $R^2$ is a nitrogen atom-containing ring group or an organic group containing a nitrogen atom-containing ring group, a condensed aromatic ring group or an organic group containing a condensed aromatic ring group, a protected phenolic hydroxy group or an organic group containing a protected phenolic hydroxy group, or a bisaryl group or an organic group containing a bisaryl group and is bonded to a silicon atom through a Si—C bond; $R^3$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group and is bonded to a silicon atom through a Si—C bond or a Si—N bond; $R^4$ is an alkoxy group, an acyloxy group, or a halogen atom; and a' is an integer of 1, and b is an integer of 0 or 1, where (a'+b) is an integer of 1 or 2], a hydrolysis product of the mixture, or a hydrolysis-condensation product of the mixture, where the number of moles of a Ti atom is 50% to 90% relative to the number of total moles in terms of a Ti atom and a Si atom in the composition, according to a second aspect, the thin film forming composition according to the first aspect, comprising a mixture of the titanium compound (A) selected from the group consisting of the compound of Formula (1), a titanium chelate compound, and a hydrolyzable titanium dimer, the silicon compound (B) of Formula (2), and a silicon compound (C) of Formula (3):

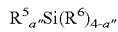  Formula (3)

[in Formula (3), $R^5$ is an alkyl group, an aryl group, a halogenated alkyl group, a halogenated aryl group, an alkenyl group, or an organic group having an epoxy group, an acryloyl group, a methacryloyl group, a mercapto group, an amino group, a sulfonyl group, a sulfide bond, an ether bond, an ester bond, a sulfonamido group, or a cyano group and is bonded to a silicon atom through a Si—C bond; $R^6$ is an alkoxy group, an acyloxy group, or a halogen atom; and a'' is an integer of 0 to 3), a hydrolysis product of the mixture, or a hydrolysis-condensation product of the mixture, according to a third aspect, the thin film forming composition according to the first aspect or the second aspect, in which the nitrogen atom-containing ring group or the organic group containing a nitrogen atom-containing ring group is an organic group of Formula (4):

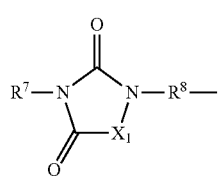  Formula (4)

[in Formula (4), $R^7$ is a hydrogen atom, a $C_{1-10}$ alkyl group, an alkenyl group, an epoxy group, a sulfonyl group, or an organic group containing any of a $C_{1-10}$ alkyl group, an alkenyl group, an epoxy group, and a sulfonyl group; $R^8$ is a $C_{1-10}$ alkylene group, a hydroxyalkylene group, a sulfide bond, an ether bond, an ester bond, or a combination of any of a $C_{1-10}$ alkylene group, a hydroxyalkylene group, a sulfide bond, an ether bond, and an ester bond; and $X_1$ is a group of Formula (5), Formula (6), or Formula (7):

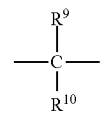  Formula (5)

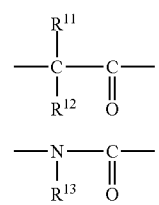  Formula (6)

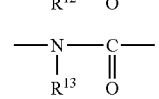  Formula (7)

{in Formula (5), Formula (6), and Formula (7), $R^9$ to $R^{13}$ are independently a hydrogen atom, a $C_{1-10}$ alkyl group, an alkenyl group, an epoxy group, a sulfonyl group, or an organic group containing any of a hydrogen atom, a $C_{1-10}$ alkyl group, an alkenyl group, an epoxy group, and a sulfonyl group}] and is an organic group bonded to a silicon atom through a Si—C bond, according to a fourth aspect, the thin film forming composition according to the first aspect or the second aspect, in which the nitrogen atom-containing ring group or the organic group containing a nitrogen atom-containing ring group is an imidazole group or an organic group containing an imidazole group, according to a fifth aspect, the thin film forming composition according to the first aspect or the second aspect, in which the condensed aromatic ring group or the organic group containing a condensed aromatic ring group is a naphthyl group or an anthryl group, according to a sixth aspect, the thin film forming composition according to the first aspect or the second aspect, in which the protected phenolic hydroxy group or the organic group containing a protected phenolic hydroxy group is an alkoxyalkyl-substituted aryl group or an alkoxyalkoxyalkyl-substituted aryl group, according to a seventh aspect, the thin film forming composition according to the first aspect or the second aspect, in which the bisaryl group or the organic group containing a bisaryl group is a bisphenyl group, according to an eighth aspect, the thin film forming composition according to any one of the first aspect to the seventh aspect, further comprising β-diketone and/or β-ketoester, according to a ninth aspect, the thin film forming composition according to any one of the first aspect to the eighth aspect, further comprising an acid, according to a tenth aspect, the thin film forming composition according to any one of the first aspect to the ninth aspect, further comprising a salt, according to an eleventh aspect, the thin film forming composition according to any one of the first aspect to the tenth aspect, further comprising water, according to a twelfth aspect, a thin film obtained by applying the thin film forming composition as described in any one of the first aspect to the eleventh aspect onto a semiconductor substrate and by baking the composition, according to a thirteenth aspect, a method for producing a semiconductor device, comprising: applying the thin film forming composition as described in any one of the first aspect to the eleventh aspect onto a semiconductor substrate and baking the composition to form a thin film; applying a composition for a resist onto the thin film to form a resist film; exposing the resist film to light; developing the resist film after the exposure to obtain a resist pattern; etching the thin film according to the resist pattern; and processing the semiconductor substrate according to the patterned resist film and the patterned thin film, according to a fourteenth aspect, a method for producing a semiconductor device, comprising: forming an organic underlayer film on a semiconductor substrate; applying the thin film forming composition as described in any one of the first aspect to the eleventh aspect onto the organic underlayer film and baking the composition to form a thin film; applying a composition for a resist onto the thin film to form a resist film; exposing the resist film to light; developing the resist film after the exposure to obtain a resist pattern; etching the thin film according to the resist pattern; etching the organic underlayer film according to the patterned thin film; and processing the semiconductor substrate according to the patterned organic underlayer film, according to a fifteenth aspect, a method for producing a semiconductor device, comprising: forming an organic underlayer film on a semiconductor substrate; applying the thin film forming composition as described in any one of the first aspect to the eleventh aspect onto the organic underlayer film and baking the composition to form a thin film; applying an organic resist underlayer film forming composition onto the thin film to form an organic resist underlayer film; applying a composition for a resist onto the organic resist underlayer film to form a resist film; exposing the resist film to light; developing the resist film after the exposure to obtain a resist pattern; etching the organic resist underlayer film according to the resist pattern; etching the thin film according to the patterned organic resist underlayer film; etching the organic underlayer film according to the patterned thin film; and processing the semiconductor substrate according to the patterned organic underlayer film, according to a sixteenth aspect, a method for producing a semiconductor device, comprising: fainting a resist pattern on a substrate; applying the thin film forming composition as described in any one of the first aspect to the eleventh aspect onto the substrate on which the resist pattern is formed and baking the composition to form a thin film; etching the thin film to expose the resist surface; and etching the resist pattern to reverse the pattern, according to a seventeenth aspect, the method according to any one of the thirteenth aspect to the sixteenth aspect, in which the resist is an EUV resist, and according to an eighteenth aspect, a method for producing a semiconductor device, comprising: applying a composition for an EUV resist onto a semiconductor substrate and baking the composition to form an EUV resist film; applying the thin film forming composition as described in any one of the first aspect to the eleventh aspect onto the EUV resist film to form a thin film; exposing the thin film to EUV; developing the EUV resist after the exposure to obtain a resist pattern; and processing the semiconductor substrate according to the resist pattern.

Effects of the Invention

In the present invention, the thin film is formed by an applying method either on a substrate or on an organic underlayer film formed on a substrate, and on the thin film, a resist film (for example, a photoresist, an electron beam resist, or an EUV resist) is formed. Then, a resist pattern is formed by exposure and development, and the substrate is processed either by dry etching the thin film using the resist pattern to transfer the pattern, and then using the transferred pattern, or by etching the organic underlayer film to transfer the pattern, and then using the etched organic underlayer In forming a fine pattern, for preventing a pattern collapse, the resist film thickness tends to be small. Due to the thinning of the resist, in the dry etching for transferring the pattern to a film existing as an underlayer of the resist, it is impossible to transfer the pattern unless the etching rate of the underlayer film is higher than that of the upper layer film. In the present invention, the substrate is coated with the thin film (containing an inorganic titanium-silicon-based compound) of the present invention either with or without an organic underlayer film interposed therebetween, and then the thin film is coated with a resist film (an organic resist film). An organic component film and an inorganic component film have dry etching rates largely different from each other depending on the selection of the etching gas such that the dry etching rate of the organic component film is enhanced by an oxygen-based gas and the dry etching rate of the inorganic component film is enhanced by a halogen-containing gas.

For example, there is formed a resist pattern that is transferred to the thin film of the present invention existing as the underlayer of the resist by dry etching the thin film with a halogen-containing gas, and the substrate is processed with a halogen-containing gas according to the pattern transferred to the thin film. Alternatively, by dry etching the organic underlayer film, existing as the underlayer of the thin film to which the pattern is transferred, with an oxygen-based gas using the thin film, the pattern is transferred to the organic underlayer film, and the substrate is processed with a halogen-containing gas using the organic underlayer film to which the pattern is transferred.

In the present invention, the thin film has the hardmask functions as a resist underlayer film and a hydrolyzable group in the structures of the compounds of Formula (1), Formula (2), and Formula (3) such as an alkoxy group, an acyloxy group, and a halogen group is hydrolyzed or partially hydrolyzed to generate thereafter by a condensation reaction of the resultant hydroxy group, a copolymer having polytitanoxane (Ti—O—Ti structure), polyorganosiloxane (Si—O—Si structure), or a Ti—O—Si structure. Although the thin film of the present invention contains as the main component, a copolymer having a Ti—O—Si structure, the thin film may contain polytitanoxane (Ti—O—Ti structure) or polyorganosiloxane (Si—O—Si structure). These structures have a satisfactory antireflection function and a satisfactory hardmask function.

Then, an inorganic polymer (intermediate film) is effective as a hardmask for etching an organic underlayer film existing as an underlayer of the intermediate film or for processing (etching) the substrate. That is, the intermediate film has satisfactory dry etching resistance during the substrate processing or against an oxygen-based dry etching gas for etching the organic underlayer film.

The thin film of the present invention possesses an enhanced dry etching rate of the thin film relative to the upper layer resist, and dry etching resistance during the substrate processing or the like.

The thin film forming composition of the present invention can be used as a film forming composition for the EUV resist upper layer, which, as an upper layer film of an EUV resist, causes no intermixing with the EUV resist, can block exposure light undesirable during EUV exposure, such as UV and DUV, can selectively transmit EUV alone, and can be developed with a developer after exposure.

During exposure of the EUV resist, EUV light is radiated together with UV light and DUV light. The EUV light contains around 5% of light having a wavelength of 300 nm or less besides EUV light. Light of wavelengths of, for example, 190 to 300 nm, 190 to 250 nm, particularly around 200 to 240 nm leads to the lowering of the sensitivity of the EUV resist or the degradation of the pattern shape. When the line width of the pattern is 22 nm or less, LTV light or DUV light (OUT-of-BAND/out-of-band radiation) starts to influence the pattern and affects adversely the resolution of the EUV resist.

Although there is a method for locating a filter in the lithography system in order that light of wavelengths of around 200 to 240 nm is removed, the process is complicated. In the present invention, the thin film as the resist upper layer can absorb undesirable DUV light of 200 to 240 nm among OUT-of-BAND lights (out-of-band radiation) contained in EUV exposure light to enhance the resolution of the EUV resist. The DUV light of around 200 to 240 nm can be efficiently absorbed selectively by titanium oxide, so it is preferable that an inorganic polymer used for the thin film as the EUV resist upper layer contains titanium oxide.

The inorganic polymer containing titanium oxide can be dissolved in a developer (for example, an alkaline developer) together with the EUV resist during development after exposure, so that it can be dissolved and removed by a developer.

The thin film forming composition of the present invention can be used as an underlayer anti-reflective coating of the EUV resist, which, as an underlayer film of the EUV resist, causes no intermixing with the EUV resist, and can prevent the reflection of exposure light undesirable during EUV exposure, for example, the above UV or DUV from the substrate or the interface. The thin film forming composition of the present invention can efficiently prevent the reflection as an underlayer of the EUV resist.

The thin film forming composition of the present invention can be used as a reverse material. The thin film forming composition of the present invention can be used as the reverse material as follows: a resist pattern formed on a substrate is coated with the thin film forming composition of the present invention, and the composition is dried to form a thin film; and then, the thin film is etched back so that the resist pattern surface is exposed, and the resist is dry-etched with a gas (for example, an oxygen-based gas) capable of selectively removing the resist to leave only the thin film layer, thereby reversing the pattern.

MODES FOR CARRYING OUT THE INVENTION

Figure 1:
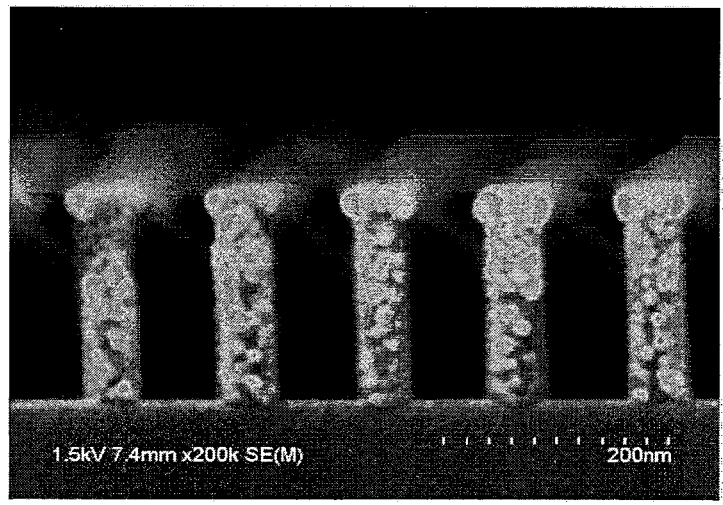
FIG. 1 is an electron microscope photograph of a cross section of a resist pattern obtained in Example 1.

The present invention is a thin film forming composition used together with a resist in a lithography process, comprising a mixture of a titanium compound (A) selected from a group consisting of a compound of Formula (1), a titanium chelate compound, and a hydrolyzable titanium dimer and a silicon compound (B) of Formula (2), a hydrolysis product of the mixture, or a hydrolysis-condensation product of the mixture, where in the composition, the number of moles of a Ti atom is 50% to 90%, preferably 55% to 90%, and more preferably 60% to 90% relative to the number of total moles in terms of a Ti atom and a Si atom.

The present invention is also a thin film forming composition used together with a resist in a lithography process, comprising a mixture of the titanium compound (A) selected from the group consisting of the compound of Formula (1), a titanium chelate compound, and a hydrolyzable titanium dimer, the silicon compound (B) of Formula (2), and a silicon compound (C) of Formula (3), a hydrolysis product of the mixture, or a hydrolysis-condensation product of the mixture, where in the composition, the number of moles of a Ti atom is 50% to 90%, preferably 55% to 90%, and more preferably 60% to 90% relative to the number of total moles in terms of a Ti atom and a Si atom.

When the mixture of the titanium compound (A) selected from the group consisting of the compound of Formula (1), a titanium chelate compound, and a hydrolyzable titanium dimer, the silicon compound (B) of Formula (2), and the silicon compound (C) of Formula (3) is used, the silicon compound (B) of Formula (2) and the silicon compound (C) of Formula (3) can be contained in the composition in such a ratio that the ratio of the silicon compound (B) of Formula (2) in the whole of these silicon compounds is less than 50% by mole, for example, 0.5 to 40% by mole.

The thin film forming composition of the present invention contains the mixture of the titanium compound (A) selected from the group consisting of the compound of Formula (1), a titanium chelate compound, and a hydrolyzable titanium dimer, the silicon compound (B) of Formula (2), and the silicon compound (C) of Formula (3), a hydrolysis product of the mixture, or a hydrolysis-condensation product of the mixture, and a solvent.

Then, the thin film forming composition of the present invention may contain as an optional component, an acid, water, an alcohol, a curing catalyst, an acid generator, another organic polymer, a light absorptive compound, a surfactant, and the like.

The solid content in the thin film forming composition of the present invention is, for example, 0.1 to 50% by mass, or 0.1% by mass to 30% by mass, or 0.1% by mass to 25% by mass. Here, the solid content is a component remaining after removing a solvent component from all components of the thin film forming composition.

The ratio of hydrolyzable titanium, hydrolyzable organosilane, a hydrolysis product thereof, and a hydrolysis-condensation product thereof constituted in the solid content is 20% by mass or more, for example, 50 to 100% by mass, or 60 to 100% by mass, or 70 to 100% by mass.

In the compound (hereinafter, called also hydrolyzable titanium) of Formula (1) used in the present invention, $R^0$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group and is bonded to a titanium atom through a Ti—C bond. $R^1$ is an alkoxy group, an acyloxy group, or a halogen atom. a is an integer of 0 to 2.

The compound of Formula (1) can be preferably used when a is 0.

Examples of the alkyl group include linear or branched alkyl groups having carbon atom number of 1 to 10 such as a methyl group, an ethyl group, an n-propyl group, an isopropyl group, an n-butyl group, an isobutyl group, a sec-butyl group, a tert-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n- butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group.

As the alkyl group, a cyclic alkyl group can also be used and examples of the $C_{1-10}$ cyclic alkyl group include a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the $C_{1-10}$ alkylene group include alkylene groups derived from the above alkyl groups.

Examples of the aryl group include $C_{6-20}$ aryl groups such as a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-mercaptophenyl group, an o-methoxyphenyl group, a p-methoxyphenyl group, a p-aminophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of the alkenyl group include $C_{2-10}$ alkenyl groups such as an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethyl ethenyl group, a 1-methyl-1-propenyl group, a 1-methyl-2-propenyl group, a 1-pentenyl group, a 2-pentenyl group, a 3-pentenyl group, a 4-pentenyl group, a 1-n-propyl ethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-isopropyl ethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butyl ethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-sec-butyl ethenyl group, a 1,3-dimethyl-1-butenyl group, a 1,3-dimethyl-2-butenyl group, a 1,3-dimethyl-3-butenyl group, a 1-isobutyl ethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-isopropyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-tert-butyl ethenyl group, a 1-methyl-1-ethyl-2-propenyl group, a 1-ethyl-2-methyl-1-propenyl group, a 1-ethyl-2-methyl-2-propenyl group, a 1-isopropyl-1-propenyl group, a 1-isopropyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Examples of the halogenated alkyl group and the halogenated aryl group include the above alkyl groups and aryl groups in which one or more hydrogen atom(s) is(are) substituted with a halogen atom such as a fluorine atom, a chlorine atom, a bromine atom, and an iodine atom.

Examples of the organic group having an epoxy group include a glycidoxymethyl group, a glycidoxyethyl group, a glycidoxypropyl group, a glycidoxybutyl group, and an epoxycyclohexyl group.

Examples of the organic group having an acryloyl group include an acryloylmethyl group, an acryloylethyl group, and an acryloylpropyl group.

Examples of the organic group having a methacryloyl group include a methacryloylmethyl group, a methacryloylethyl group, and a methacryloylpropyl group.

Examples of the organic group having a mercapto group include an ethylmercapto group, a butylmercapto group, a hexylmercapto group, and an octylmercapto group.

Examples of the organic group having an amino group include an aminomethyl group, an aminoethyl group, and an aminopropyl group.

Examples of the organic group having a cyano group include a cyanoethyl group and a cyanopropyl group.

Examples of the organic group having a sulfonyl group include a methylsulfonyl group, an allylsulfonyl group, and a phenylsulfonyl group.

Examples of the alkoxy group include $C_{1-30}$ alkoxy groups or $C_{1-10}$ alkoxy groups such as a methoxy group, an ethoxy group, an n-propoxy group, an isopropoxy group, an n-butoxy group, an isobutoxy group, a sec-butoxy group, a tert-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, a 1-ethyl-2-methyl-n-propoxy group, and a phenoxy group.

Examples of the acyloxy group include $C_{1-30}$ acyloxy groups or $C_{1-10}$ acyloxy groups such as a methylcarbonyloxy group, an ethylcarbonyloxy group, an n-propylcarbonyloxy group, an isopropylcarbonyloxy group, a cyclopropylcarbonyloxy group, an n-butylcarbonyloxy group, an isobutylcarbonyloxy group, a sec-butylcarbonyloxy group, a tert-butylcarbonyloxy group, a cyclobutylcarbonyloxy group, a 1-methyl-cyclopropylcarbonyloxy group, a 2-methyl-cyclopropylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, a cyclopentylcarbonyloxy group, a 1-methyl-cyclobutylcarbonyloxy group, a 2-methyl-cyclobutylcarbonyloxy group, a 3-methyl-cyclobutylcarbonyloxy group, a 1,2-dimethyl-cyclopropylcarbonyloxy group, a 2,3-dimethyl-cyclopropylcarbonyloxy group, a 1-ethyl-cyclopropylcarbonyloxy group, a 2-ethyl-cyclopropylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, a 1,1,2-trimethyl-n-propylcarbonyloxy group, a 1,2,2-trimethyl-n-propylcarbonyloxy group, a 1-ethyl-1-methyl-n-propylcarbonyloxy group, a 1-ethyl-2-methyl-n-propylcarbonyloxy group, a cyclohexylcarbonyloxy group, a 1-methyl-cyclopentylcarbonyloxy group, a 2-methyl-cyclopentylcarbonyloxy group, a 3-methyl-cyclopentylcarbonyloxy group, a 1-ethyl-cyclobutylcarbonyloxy group, a 2-ethyl-cyclobutylcarbonyloxy group, a 3-ethyl-cyclobutylcarbonyloxy group, a 1,2-dimethyl-cyclobutylcarbonyloxy group, a 1,3-dimethyl-cyclobutylcarbonyloxy group, a 2,2-dimethyl-cyclobutylcarbonyloxy group, a 2,3-dimethyl-cyclobutylcarbonyloxy group, a 2,4-dimethyl-cyclobutylcarbonyloxy group, a 3,3-dimethyl-cyclobutylcarbonyloxy group, a 1-n-propyl-cyclopropylcarbonyloxy group, a 2-n-propyl-cyclopropylcarbonyloxy group, a 1-isopropyl-cyclopropylcarbonyloxy group, a 2-isopropyl-cyclopropylcarbonyloxy group, a 1,2,2-trimethyl-cyclopropylcarbonyloxy group, a 1,2,3-trimethyl-cyclopropylcarbonyloxy group, a 2,2,3-trimethyl-cyclopropylcarbonyloxy group, a 1-ethyl-2-methyl-cyclopropylcarbonyloxy group, a 2-ethyl-1-methyl-cyclopropylcarbonyloxy group, a 2-ethyl-2-methyl-cyclopropylcarbonyloxy group, and a 2-ethyl-3-methyl-cyclopropylcarbonyloxy group.

Examples of the halogen atom include a fluorine atom, a chlorine atom, a bromine atom, and an iodine atom.

In the compound (a hydrolyzable titanium compound) of Formula (1), when $R^1$ is an alkoxy group, $R^1$s may be either the same alkoxy group or different alkoxy groups. Also when $R^1$ is an acyloxy group or a halogen atom, $R^1$s may be either the same acyloxy group or the same halogen group or different acyloxy groups or different halogen groups.

Examples of the compound (a hydrolyzable titanium compound) of Formula (1) include: alkoxy titanium such as tetramethoxy titanium, tetraethoxy titanium, tetraisopropoxy titanium, tetra-n-butoxy titanium, tetraisobutoxy titanium, titanium tetra-2-ethylhexoxide, tetrakis(methoxypropoxy) titanium, tetraphenoxy titanium, tetrabenzyloxy titanium, tetraphenylethoxy titanium, tetraphenoxyethoxy titanium, tetranaphthyloxy titanium, tetra-2-ethylhexoxy titanium, monoethoxytriisopropoxy titanium, diisopropoxydiisobutoxy titanium, allyloxy(polyethyleneoxy)tris-isopropoxy titanium, titanium chloride triisopropoxide, titanium dichloride diethoxide, titanium 2-ethylhexoxide, titanium iodide triisopropoxide, titanium tetramethoxypropoxide, titanium tetramethylphenoxide, titanium n-nonyloxide, titanium tetrastearyloxide, and titanium triisostearoyl-monoisopropoxide; and acyloxy titanium such as tetramethylcarbonyloxy titanium, tetraethylcarbonyloxy titanium, tetra-n-propylcarbonyloxy titanium, tetraisopropylcarbonyloxy titanium, methylcarbonyloxytriethylcarbonyloxy titanium, and diethylcarbonyloxydiisopropylcarbonyloxy titanium.

Examples of the compound (a hydrolyzable titanium compound) of Formula (1) also include halogenated titanium such as titanium tetrafluoride, titanium tetrachloride, titanium tetrabromide, and titanium tetraiodide.

Examples of the compound (hydrolyzable titanium compound) of Formula (1) also include hydrolyzable alkylalkoxy titanium such as methyl titanium tris-isopropoxide, ethyl titanium tris-isopropoxide, and methyl titanium tris-butoxide.

Examples of the titanium chelate compound (hereinafter, called also hydrolyzable titanium chelate compound) used in the present invention include titanium chelate compounds such as tetra-2-ethylhexyl titanate, isopropyl isostearoyl diacryl titanate, isopropyl dimethacryl isostearoyl titanate, isopropyl tri(n-aminoethyl-aminoethyl) titanate, isopropyl tri(dioctyl phosphate) titanate, isopropyl triisostearoyl titanate, isopropyl trioctanoyl titanate, isopropyl tricumyl phenyl titanate, isopropyl tris(dioctyl pyrophosphate) titanate, isopropyl tridecyl benzene sulfonyl titanate, octylene glycol titanate, a cresyl titanate monomer, di-n-butoxy bis(triethanolaminate)titanium, diisostearoyl ethylene titanate, diisopropyl bis(triethanolamino) titanate, diisopropoxy bis(acetylacetonate)titanium, diculnyl phenyloxy acetate titanate, dihydroxy bis(lactato)titanium, stearyl titanate, titanium isopropoxy octylene glycolate, titanium stearate, titanium lactate, tetra(2,2-diallyloxymethyl-1-butyl) bis(ditridecyl) phosphite titanate, tetraisopropyl bis(dioctyl phosphite) titanate, tetraoctyl bis(ditridecyl phosphite) titanate, tetrakis(2-ethylhexyl)titanium, bis(dioctyl pyrophosphate) ethylene titanate, bis(dioctyl pyrophosphate)oxyacetate titanate, titanium diisopropoxy bis(acetylacetonate), titanium tetraacetylacetonate, titanium di-2-ethylhexoxy bis(2-ethyl-3-hydroxyhexoxide), titanium diisopropoxy bis(ethylacetoacetate), titanium diisopropoxy bis(triethanolaminate), a titanium lactate ammonium salt, titanium lactate, polyhydroxy titanium stearate, titanium tetraacetylacetonate, triethoxy-mono(acetylacetonate)titanium, tri-n-propoxy-mono(acetylacetonate)titanium, triisopropoxy-mono(acetylacetonate)titanium, tri-n-butoxy-mono(acetylacetonate)titanium, tri-sec-butoxy-mono(acetylacetonate)titanium, tri-tert-butoxy-mono(acetylacetonate)titanium, diethoxy-bis(acetylacetonate)titanium, di-n-propoxy-bis(acetylacetonate)titanium, diisopropoxy-bis(acetylacetonate)titanium, di-n-butoxy-bis(acetylacetonate)titanium, di-sec-butoxy-bis(acetylacetonate)titanium, di-tert-butoxy-bis(acetylacetonate)titanium, monoethoxy-tris(acetylacetonate)titanium, mono-n-propoxy-tris(acetylacetonate)titanium, monoisopropoxy-tris(acetylacetonate) titanium, mono-n-butoxy-tris(acetylacetonate)titanium, mono-sec-butoxy-tris(acetylacetonate)titanium, mono-tertbutoxy-tris(acetylacetonate)titanium, tetrakis(acetylacetonate)titanium, triethoxy-mono(ethylacetoacetate)titanium, tri-n-propoxy-mono(ethylacetoacetate)titanium, triisopropoxy-mono(ethylacetoacetate)titanium, tri-n-butoxy-mono(ethylacetoacetate)titanium, tri-sec-butoxy-mono(ethylacetoacetate)titanium, tri-tert-butoxy-mono(ethylacetoacetate)titanium, diethoxy-bis(ethylacetoacetate)titanium, di-n-propoxy-bis(ethylacetoacetate)titanium, diisopropoxy-bis(ethylacetoacetate)titanium, di-n-butoxy-bis(ethylacetoacetate)titanium, di-sec-butoxy-bis(ethylacetoacetate)titanium, di-tert-butoxy-bis(ethylacetoacetate)titanium, monoethoxy-tris(ethylacetoacetate)titanium, mono-n-propoxy-tris(ethylacetoacetate)titanium, monoisopropoxy-tris(ethylacetoacetate)titanium, mono-n-butoxy-tris(ethylacetoacetate)titanium, mono-sec-butoxy-tris(ethylacetoacetate)titanium, mono-tert-butoxy-tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, tris(acetylacetonate)mono(ethylacetoacetate)titanium, bis(2,6-difluoro-3-(1-hydropyrrol-1-yl)phenyl) titanocene, pentamethylcyclopentadienyl titanium trichloride, pentamethylcyclopentadienyl titanium trimethoxide, phthalocyanine-titanium oxide, titanium allylacetoacetate triisopropoxide, titanium bis(triethanolamine)diisopropoxide, titanium di-n-butoxide (bis-2,4-pentanedionate), titanium diethyldithiocarbamate, titanium diisopropoxide (bis-2,4-pentanedionate), titanium diisopropoxide bis(tetramethylheptanedionate), titanium diisopropoxide bis(ethyl acetoacetate), titanium methacryloxyethylacetoacetate trisisopropoxide, (2-methacryloxyethoxy)triisopropoxy titanate, titanium oxide bis(pentanedionate), titanium oxide bis(tetramethylheptanedionate), titanium tetrakis(bis-2,2-(allyloxymethyl)butoxide, titanium tetrakis(diethylamide), titanium tetrakis(dimethylamide), titanium triisopropoxide-tri-n-butyl stannoxide, titanium trimethacrylate methoxyethoxyethoxide, titanium tetrakis(trimethylsiloxide), titanium tris(dioctylphosphite)isopropoxide, titanium tris(dodecylbenzenesulfonate)isopropoxide, bis(cyclopentadienyl) titanium dichloride, poly(octylene glycol titanate), and a diethoxysiloxaneethyl titanate copolymer.

The hydrolyzable titanium dimer used in the present invention is a compound produced by dimerizing alkoxy titanium, halogenated titanium, or acyloxy titanium through a Ti—O—Ti bond and has a structure of $(R^1)_3$—Ti—O—Ti—$(R^1)_3$. Examples of the hydrolyzable titanium dimer include a titanium butoxide dimer, a titanium isobutoxide dimer, a titanium propoxide dimer, and a titanium isopropoxide dimer.

As the titanium compound (A), a titanium compound selected from the group consisting of compounds of Formula (1) and titanium chelate compounds is preferably used.

Then, as the titanium compound (A), a titanium compound selected from the group consisting of compounds of Formula (1) is preferably used.

In the silicon compound (B) [hereinafter, called also hydrolyzable silane compound (B)] of Formula (2) used in the present invention, $R^2$ is a nitrogen atom-containing ring group or an organic group containing the same, a condensed aromatic ring group or an organic group containing the same, a protected phenolic hydroxy group or an organic group containing the same, or a bisaryl group or an organic group containing the same and is bonded to a silicon atom through a Si—C bond, and $R^3$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group and is bonded to a silicon atom through a Si—C bond or a Si—N bond. $R^4$ is an alkoxy group, an acyloxy group, or a halogen atom. a' is an integer of 1, and b is an integer of 0 or 1, where (a'+b) is an integer of 1 or 2.

Examples of the alkoxy group, the acyloxy group, and the halogen atom include the groups and atoms exemplified above.

Examples of the nitrogen atom-containing ring group or the organic group containing the same include organic groups of Formula (4) that are bonded to a silicon atom through a Si—C bond. By using the nitrogen atom-containing ring group of Formula (4), the adhesion of the thin film to another layer can be enhanced.

In Formula (4), $R^7$ is a hydrogen atom, a $C_{1-10}$ alkyl group, an alkenyl group, an epoxy group, a sulfonyl group, or an organic group containing any of these groups, and $R^8$ is a $C_{1-10}$ alkylene group, a hydroxyalkylene group, a sulfide bond, an ether bond, an ester bond, or a combination thereof.

$X_1$ is a group of Formula (5), Formula (6), or Formula (7).

In Formula (5), Formula (6), and Formula (7), $R^9$ to $R^{13}$ are independently a hydrogen atom, a $C_{1-10}$ alkyl group, an alkenyl group, an epoxy group, a sulfonyl group, or an organic group containing any of these groups.

Examples of the nitrogen atom-containing ring group or the organic group containing the same include an imidazole group and organic groups containing an imidazole group.

Examples of the condensed aromatic ring group or the organic group containing the same include a naphthyl group and an anthryl group. By using the condensed aromatic ring group, the absorption of OUT-of-BAND can be enhanced.

Examples of the protected phenolic hydroxy group or the organic group containing the same include an alkoxyalkyl-substituted aryl group and an alkoxyalkoxyalkyl-substituted aryl group. By using the protected phenolic hydroxy group, the acidity of the composition can be enhanced to enhance the resist profile.

Examples of the bisaryl group or the organic group containing the same include a bisphenyl group.

Examples of the alkyl group, the aryl group, the alkenyl group, the halogenated alkyl group, the halogenated aryl group, the organic group having an epoxy group, the organic group having an acryloyl group, the organic group having a methacryloyl group, the organic group having a mercapto group, the organic group having an amino group, the organic group having a cyano group, and the organic group having a sulfonyl group include groups exemplified above.

Examples of the silicon compound (B) [hydrolyzable silane compound (B)] of Formula (2) include silicon compounds of Formulae below.

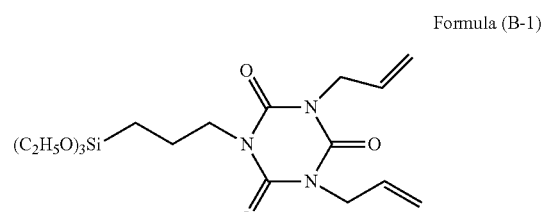

Formula (B-1)

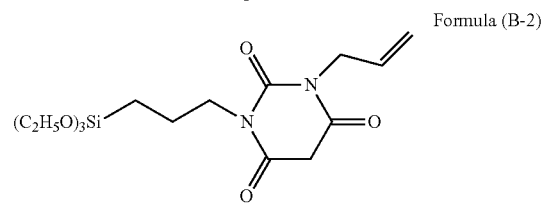

Formula (B-2)

Formula (B-3)
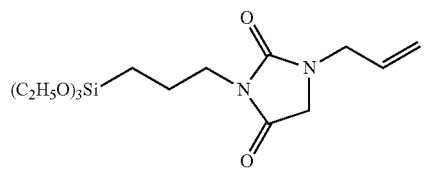
Formula (B-4)
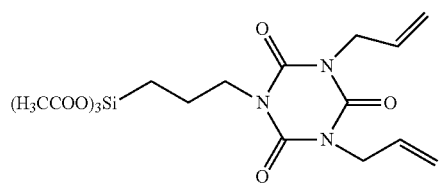
Formula (B-5)
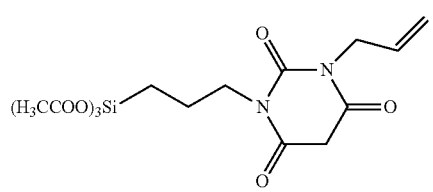
Formula (B-6)
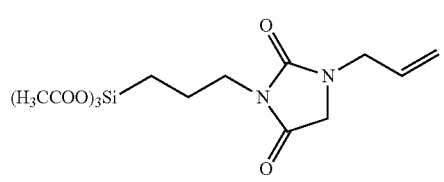
Formula (B-7)
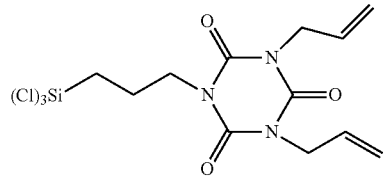
Formula (B-8)
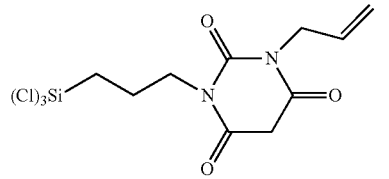
Formula (B-9)
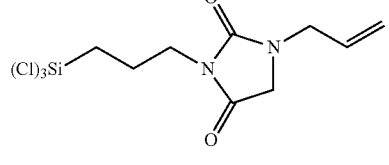
Formula (B-10)
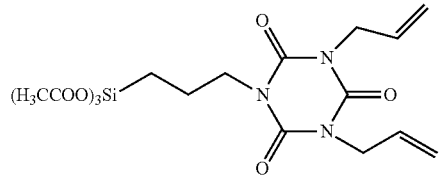
Formula (B-11)
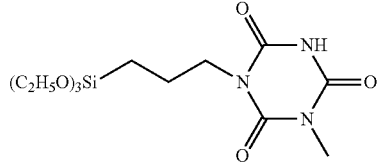
Formula (B-12)
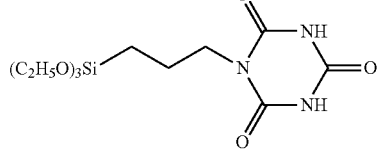
Formula (B-13)
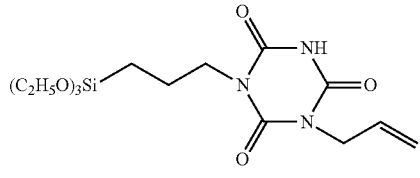
Formula (B-14)
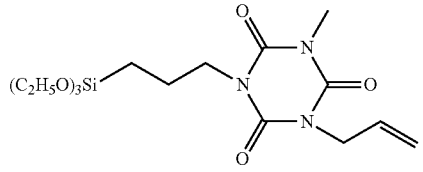
Formula (B-15)
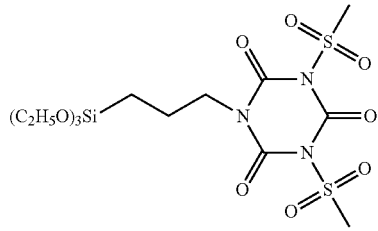
Formula (B-16)
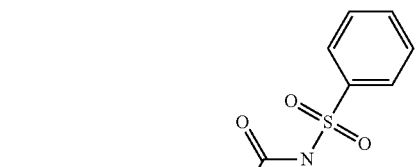
Formula (B-17)
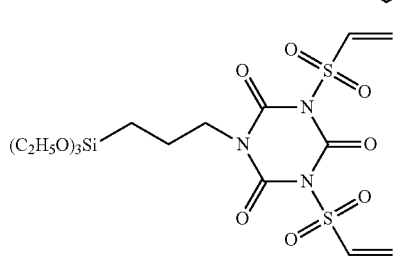

Formula (B-18)
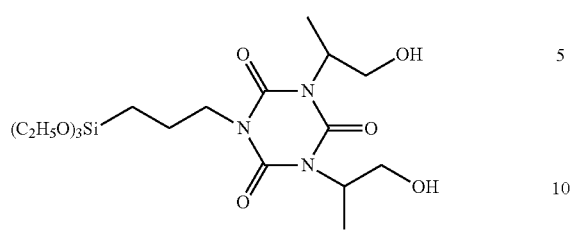
Formula (B-19)
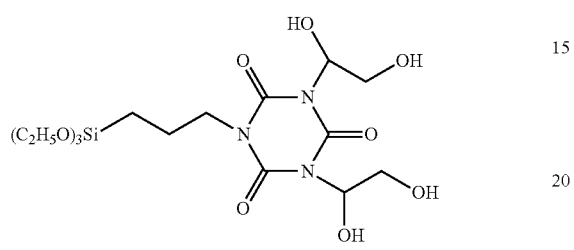
Formula (B-20)
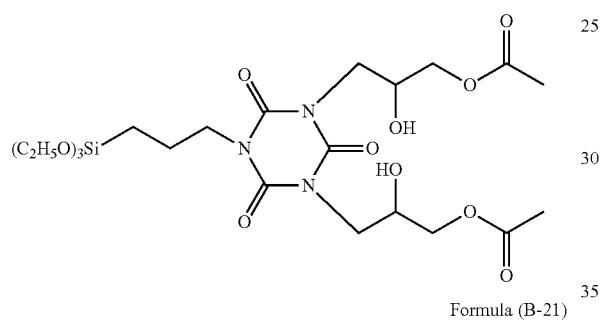
Formula (B-21)
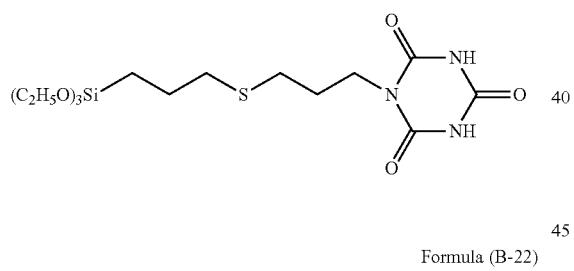
Formula (B-22)
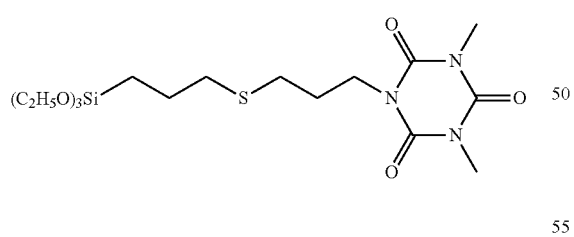
Formula (B-23)
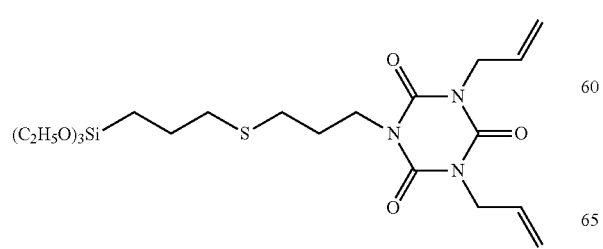
Formula (B-24)
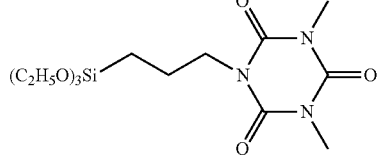
Formula (B-25)
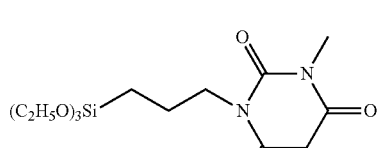
Formula (B-26)
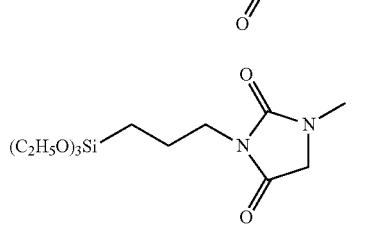
Formula (B-27)
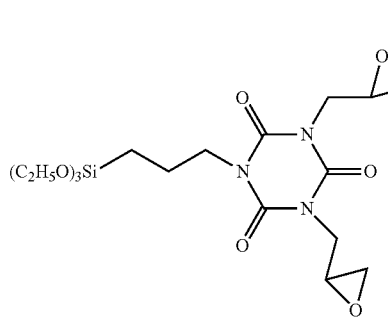
Formula (B-28)
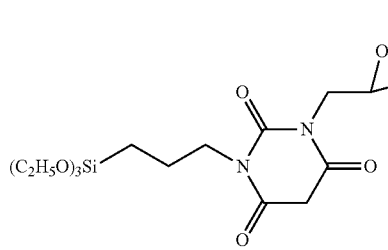
Formula (B-29)
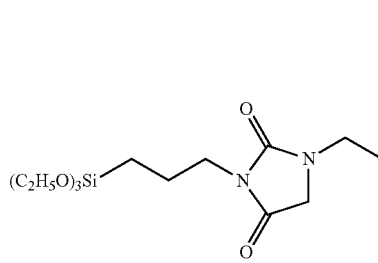
Formula (B-30)
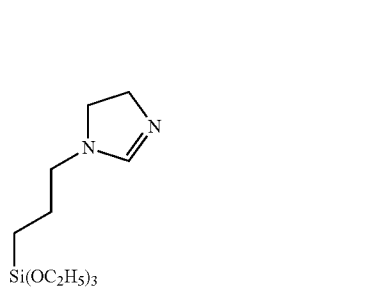

-continued
Formula (B-31)
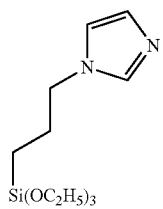
Formula (B-32)
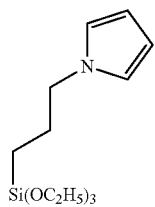
Formula (B-33)
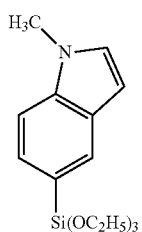
Formula (B-34)
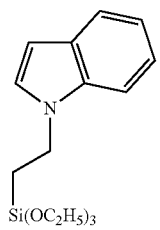
Formula (B-35)
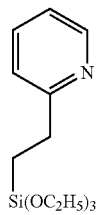
Formula (B-36)
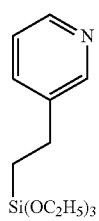
Formula (B-37)
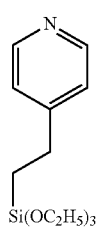
-continued
Formula (B-38)
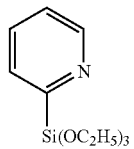
Formula (B-39)
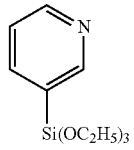
Formula (B-40)
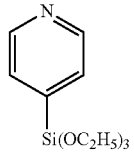
Formula (B-41)
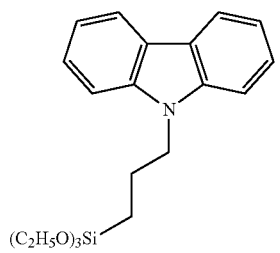
Formula (B-42)
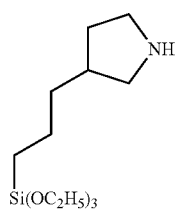
Formula (B-43)
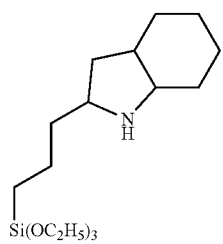
Formula (B-44)
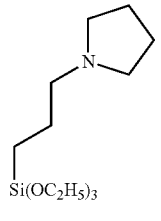
Formula (B-45)
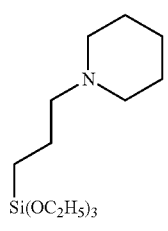

-continued
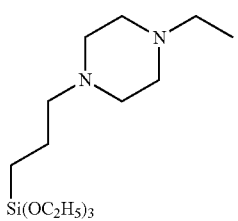
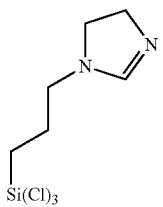
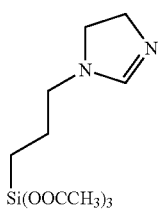
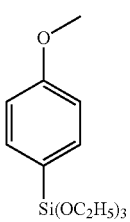
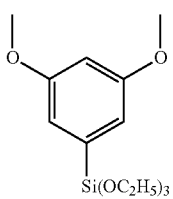
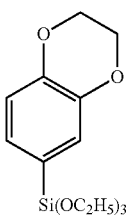
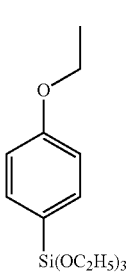
-continued
Formula (B-46)
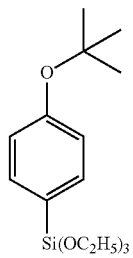
Formula (B-47)
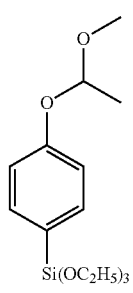
Formula (B-48)
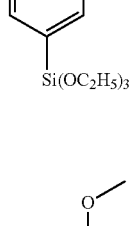
Formula (B-49)
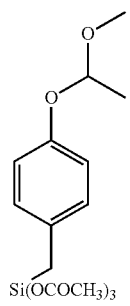
Formula (B-50)
Formula (B-51)
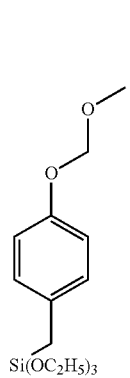
Formula (B-52)
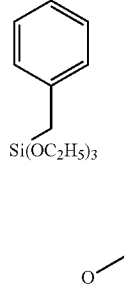
Formula (B-53)
Formula (B-54)
Formula (B-55)
Formula (B-56)
Formula (B-57)
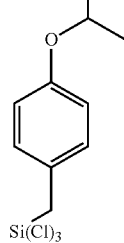

Formula (B-58)
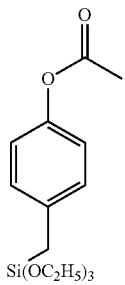
Formula (B-59)
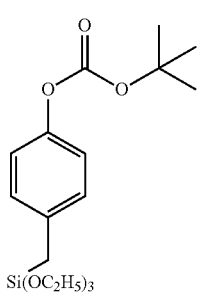
Formula (B-60)
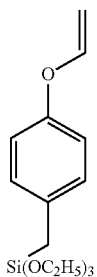
Formula (B-61)
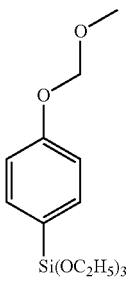
Formula (B-62)
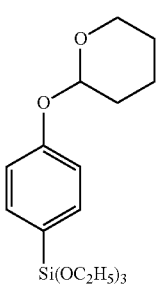
Formula (B-63)
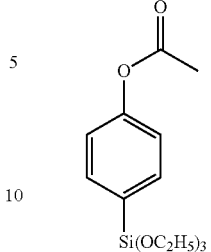
Formula (B-64)
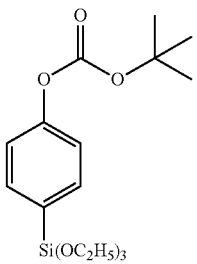
Formula (B-65)
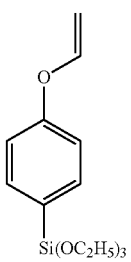
Formula (B-66)
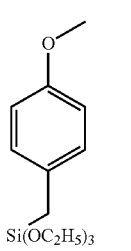
Formula (B-67)
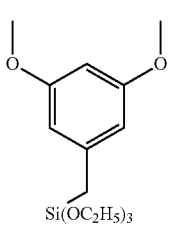
Formula (B-68)
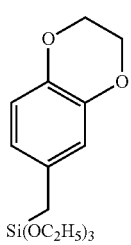

Formula (B-69)
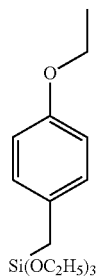
Formula (B-70)
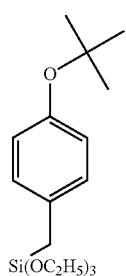
Formula (B-71)
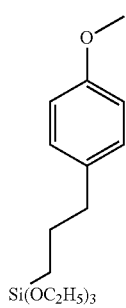
Formula (B-72)
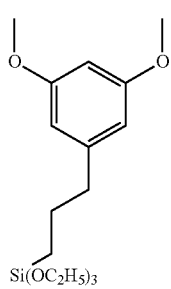
Formula (B-73)
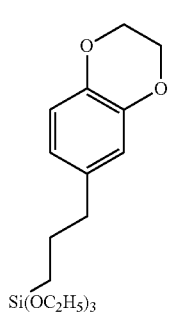
Formula (B-74)
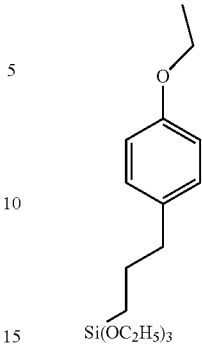
Formula (B-75)
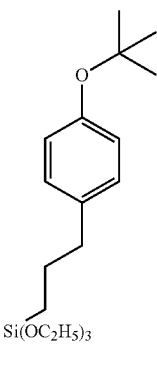
Formula (B-76)
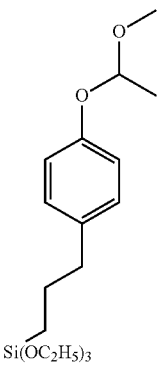
Formula (B-77)
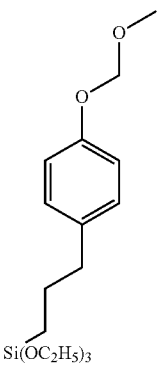

-continued

Formula (B-78)

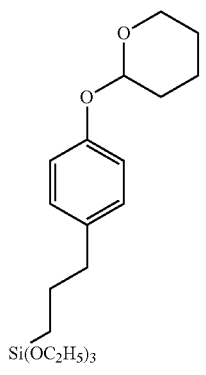

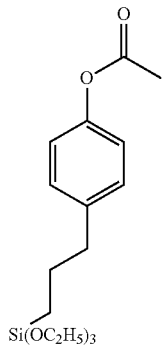

Formula (B-79)

Formula (B-80)

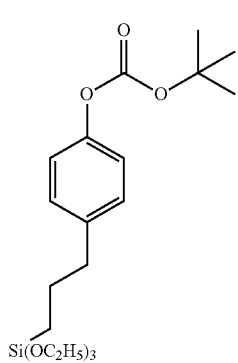

Formula (B-81)

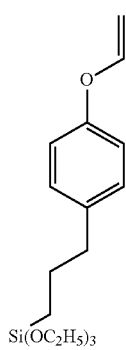

Formula (B-82)

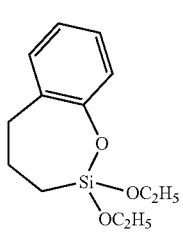

-continued

Formula (B-83)

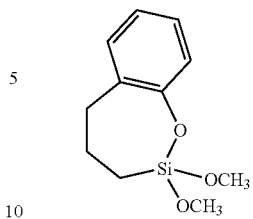

Formula (B-84)

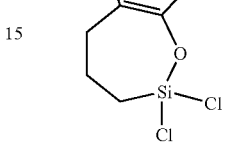

Formula (B-85)

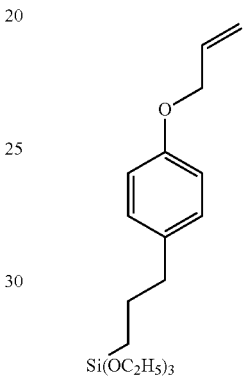

Formula (B-86)

Formula (B-87)

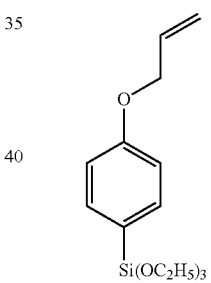

In the silicon compound (C) [hereinafter, called also hydrolyzable silane compound (C)] of Formula (3) used in the present invention, $R^5$ is an alkyl group, an aryl group, a halogenated alkyl group, a halogenated aryl group, an alkenyl group, or an organic group having an epoxy group, an acryloyl group, a methacryloyl group, a mercapto group, an amino group, a sulfonyl group, a sulfide bond, an ether bond, an ester bond, a sulfonamido group, or a cyano group and is bonded to a silicon atom through a Si—C bond. $R^6$ is an alkoxy group, an acyloxy group, or a halogen atom and a" is an integer of 0 to 3. Examples of these organic groups include organic groups exemplified above.

Examples of the sulfonamido group include a phenylsulfonamido group and a methylsulfonamido group.

Examples of the compound [hydrolyzable silane compound (C)] of Formula (3) include tetramethoxysilane, tetrachlorosilane, tetraacetoxysilane, tetraethoxysilane, tetra n-propoxysilane, tetraisopropoxysilane, tetra n-butoxysilane, tetraacetoxysilane, methyltrimethoxysilane, methyltrichlorosilane, methyltriacetoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl) ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, phenyltrimethoxysilane, phenyltrichlorosilane, phenyltriacetoxysilane, phenyltriethoxysilane, phenyltriacetoxysilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, methylvinyldiethoxysilane, phenylsulfonylaminopropyltriethoxysilane, methylsulfonylaminopropyltriethoxysilane, phenylsulfonylaminopropyltrimethoxysilane, methylsulfonylaminopropyltrimethoxysilane, N-[3-(triethoxysilyl)propyl]benzenesulfonamide, N-[3-(triethoxysilyl)propyl]methane sulfonamide, N-[3-(triethoxysilyl)propyl] allylsulfonamide, and N-[3-(triethoxysilyl)propyl] vinylsulfonamide.

Examples of the hydrolysis-condensation product (polymer, copolymer) used in the present invention include the compounds below.

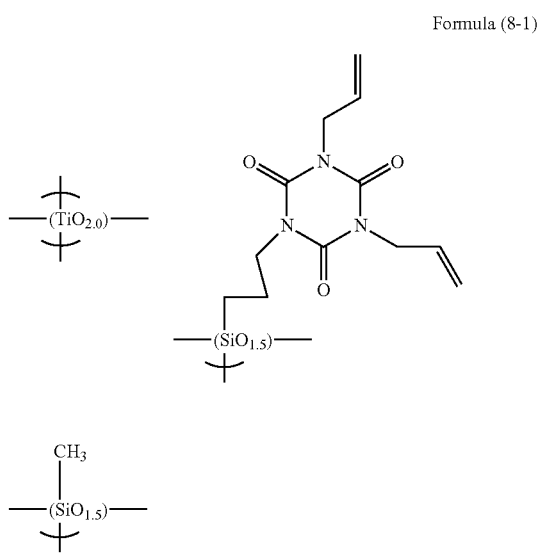

Formula (8-1)

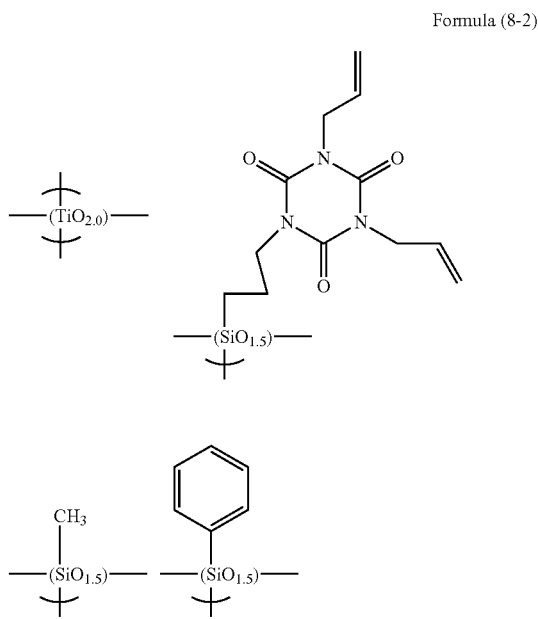

Formula (8-2)

-continued

Formula (8-3)
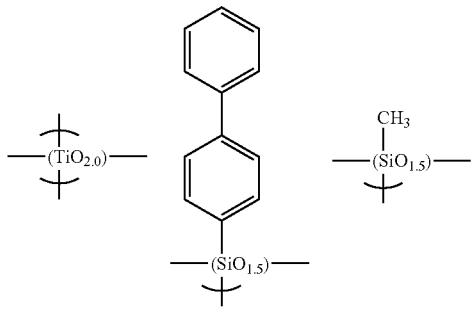

Formula (8-4)
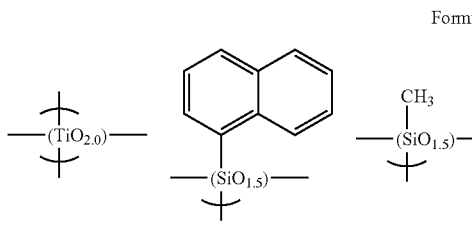

Formula (8-5)
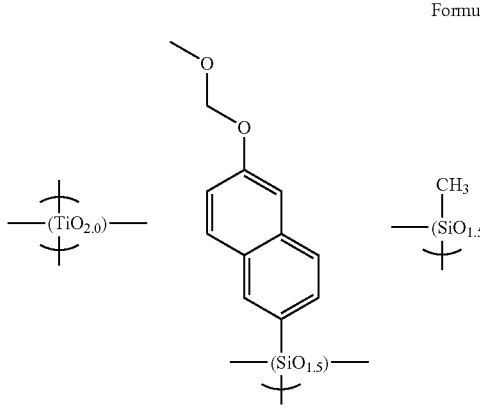

Formula (8-6)
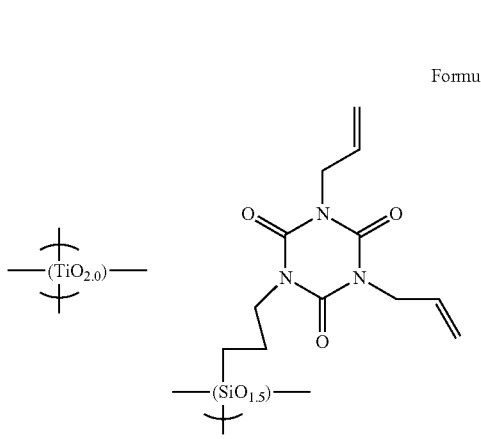

-continued

Formula (8-7)
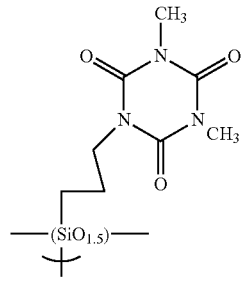

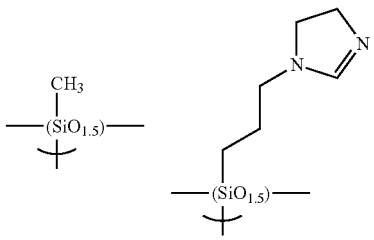

Formula (8-8)
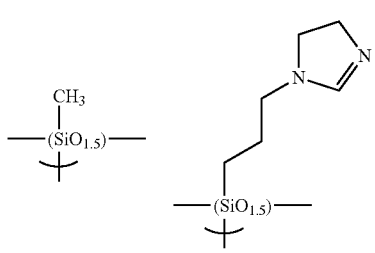

When the titanium compound (A) selected from the group consisting of the compound of Formula (1), the titanium chelate compound, and the hydrolyzable titanium dimer and the silicon compound (B) of Formula (2) are used, examples of a method for obtaining a hydrolysis-condensation product of the mixture of the titanium compound (A) and the silicon compound (B) include: a method for hydrolyzing the titanium compound (A) selected from the group consisting of the compound of Formula (1), the titanium chelate compound, and the hydrolyzable titanium dimer and the silicon compound (B) of Formula (2) to produce a co-hydrolysis-condensation product (copolymer); and a method for mixing a hydrolysis-condensation product of the titanium compound (A) selected from the group consisting of the compound of Formula (1), the titanium chelate compound, and the hydrolyzable titanium dimer and a hydrolysis-condensation product of the silicon compound (B) of Formula (2).

The titanium compound (A) selected from the group consisting of the compound of Formula (1), the titanium chelate compound, and the hydrolyzable titanium dimer, the silicon compound (B) of Formula (2), and the silicon compound (C) of Formula (3) can be used in combination thereof. Examples of a method for obtaining a hydrolysis-condensation product of the mixture of the titanium compound (A), the silicon compound (B), and the silicon compound (C) include: a method for hydrolyzing the titanium compound (A) selected from the group consisting of the compound of Formula (1), the titanium chelate compound, and the hydrolyzable titanium dimer, the silicon compound (B) of Formula (2), and the silicon compound (C) of Formula (3) to produce a co-hydrolysis-condensation product (copolymer); and a method for mixing a hydrolysis-condensation product of the titanium compound (A) selected from the group consisting of the compound of Formula (1), the titanium chelate compound, and the hydrolyzable titanium dimer, a hydrolysis-condensation product of the silicon compound (B) of Formula (2), and a hydrolysis-condensation product of the silicon compound (C) of Formula (3).

The above hydrolysis-condensation product is a polymer or a copolymer and can be obtained as a condensation product having a weight average molecular weight of 300 to 1,000,000, 300 to 100,000, or 300 to 20,000. This molecular weight is a molecular weight obtained by a GPC analysis in terms of polystyrene. Examples of the measurement conditions for the GPC analysis include: using a GPC apparatus (trade name: HLC-8220GPC; manufactured by Tosoh Corporation); using a GPC column (trade names: Shodex KF803L, KF802, and KF801; manufactured by Showa Denko K.K.); using a column temperature of 40° C.; using tetrahydrofuran as the eluting liquid (eluting solvent); using a flow amount (flow rate) of 1.0 mL/min; and using polystyrene (manufactured by Showa Denko K.K.) as the standard sample.

For obtaining the hydrolysis-condensation product by the hydrolysis of an alkoxysilyl group, an acyloxysilyl group, or a halogenated silyl group, water is used in an amount of 0.5 to 100 mol, preferably 1 to 10 mol, relative to 1 mol of a hydrolyzable group.

A hydrolysis catalyst can be used in an amount of 0.001 to 10 mol, preferably 0.001 to 1 mol, relative to 1 mol of a hydrolyzable group.

The reaction temperature for performing the hydrolysis and the condensation is usually 20 to 120° C.

The hydrolysis may be performed either completely or partially. That is, in the hydrolysis-condensation product thereof, a hydrolysis product or a monomer may remain.

During the hydrolysis and the condensation, a catalyst can be used.

Examples of the catalyst for the hydrolysis include metal chelate compounds, organic acids, inorganic acids, organic bases, and inorganic bases.

Examples of the metal chelate compound as the catalyst for the hydrolysis include: zirconium chelate compounds such as triethoxy-mono(acetylacetonate)zirconium, tri-n-propoxy-mono(acetylacetonate)zirconium, tri-isopropoxy-mono(acetylacetonate)zirconium, tri-n-butoxy-mono(acetylacetonate)zirconium, tri-sec-butoxy-mono(acetylacetonate)zirconium, tri-tert-butoxy-mono(acetylacetonate)zirconium, diethoxy-bis(acetylacetonate)zirconium, di-n-propoxy-bis(acetylacetonate)zirconium, di-isopropoxy-bis(acetylacetonate)zirconium, di-n-butoxy-bis(acetylacetonate)zirconium, di-sec-butoxy-bis(acetylacetonate)zirconium, di-tert-butoxy-bis(acetylacetonate)zirconium, monoethoxy-tris(acetylacetonate)zirconium, mono-n-propoxy-tris(acetylacetonate)zirconium, mono-isopropoxy-tris(acetylacetonate)zirconium, mono-n-butoxy-tris(acetylacetonate)zirconium, mono-sec-butoxy-tris(acetylacetonate)zirconium, mono-tert-butoxy-tris(acetylacetonate)zirconium, tetrakis(acetylacetonate)zirconium, triethoxy-mono(ethylacetoacetate)zirconium, tri-n-propoxy-mono(ethylacetoacetate)zirconium, tri-isopropoxy-mono(ethylacetoacetate)zirconium, tri-n-butoxy-mono(ethylacetoacetate)zirconium, tri-sec-butoxy-mono(ethylacetoacetate)zirconium, tri-tert-butoxy-mono(ethylacetoacetate)zirconium, diethoxy-bis(ethylacetoacetate)zirconium, di-n-propoxy-bis(ethylacetoacetate)zirconium, di-isopropoxy-bis(ethylacetoacetate)zirconium, di-n-butoxy-bis(ethylacetoacetate)zirconium, di-sec-butoxy-bis(ethylacetoacetate)zirconium, di-tert-butoxy-bis(ethylacetoacetate)zirconium, monoethoxy-tris(ethylacetoacetate)zirconium, mono-n-propoxy-tris(ethylacetoacetate)zirconium, mono-isopropoxy-tris(ethylacetoacetate)zirconium, mono-n-butoxy-tris(ethylacetoacetate)zirconium, mono-sec-butoxy-tris(ethylacetoacetate)zirconium, mono-tert-butoxy-tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, and tris(acetylacetonate)mono(ethylacetoacetate)zirconium; and aluminum chelate compounds such as tris(acetylacetonate)aluminum and tris(ethylacetoacetate)aluminum Examples of the organic acid as the catalyst for the hydrolysis include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as the catalyst for the hydrolysis include hydrochloric acid, nitric acid, sulfuric acid, hydrofluoric acid, and phosphoric acid.

Examples of the organic base as the catalyst for the hydrolysis include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclo octane, diazabicyclo nonane, diazabicyclo undecene, and tetramethylammoniumhydroxide.

Examples of the inorganic base as the catalyst for the hydrolysis include ammonia, sodium hydroxide, potassium hydroxide, barium hydroxide, and calcium hydroxide.

Among these catalysts, metal chelate compounds, organic acids, and inorganic acids are preferred and these catalysts may be used individually or in combination of two or more of them.

Examples of the organic solvent used for the hydrolysis include: aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, di-isopropylbenzene, n-amylnaphthalene, and trimethylbenzene; monoalcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyalcohol solvents such as ethylene glycol, propylene glycol, 1,3-butylene glycol, pentanediol-2,4, 2-methylpentanediol-2,4, hexanediol-2, 5, heptanediol-2,4, 2-ethylhexanediol-1,3, diethylene glycol, dipropylene glycol, triethylene glycol, tripropylene glycol, and glycerin; ketone solvents such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone; ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, propylene glycol dimethyl ether, propylene glycol diethyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethyleneglycol monomethyl ether acetate, ethyleneglycol mono ethyl ether acetate, diethyleneglycol monomethyl ether acetate, diethyleneglycol monoethyl ether acetate, diethyleneglycol mono-n-butyl ether acetate, propyleneglycol monomethyl ether acetate, propyleneglycol monoethyl ether acetate, propyleneglycol monopropyl ether acetate, propyleneglycol monobutyl ether acetate, dipropyleneglycol monomethyl ether acetate, dipropyleneglycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; ester-ether solvents such as propyleneglycol monomethyl ether acetate, propyleneglycol monoethyl ether acetate, and propyleneglycol monopropyl ether acetate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethylsulfoxide, sulfolane, and 1,3-propane sultone. These solvents may be used individually or in combination of two or more of them.

Among them, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferred.

Nonalcoholic polar solvents, for example, ketones such as acetone and tetrahydrofuran are preferred and when the hydrolyzable silane compound (B) (a silane compound having 2 to 3 hydrolyzable groups in the molecule of the silane compound during the hydrolysis) of Formula (2) is used as a raw material, the above solvents are preferred. However, in the case of a silane having 5 to 9 hydrolyzable groups in the molecule of the hydrolyzable silane compound (B), in such an acetone solvent, the hydrolysis and the condensation are excessively progressed, so that the gelation is easily caused.

From the hydrolysis-condensation product (polymer, copolymer) obtained by hydrolyzing and condensing hydrolyzable titanium, the hydrolyzable silane compound (B), and the hydrolyzable silane compound (C) in a solvent either using a catalyst or without using a catalyst, an alcohol as a by-product, the hydrolyzing catalyst used for the reaction, and the water used for the reaction can be simultaneously removed by distilling them under reduced pressure or the like. An acid catalyst or a base catalyst used for the hydrolysis can be removed by neutralization or ion exchange.

Then, in the thin film forming composition used for a lithography process of the present invention, an acid (organic acid), a salt, water, an alcohol, or a combination thereof can be blended to stabilize the composition.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among them, oxalic acid, maleic acid, acetic acid, propionic acid, butyric acid, valeric acid, hexanoic acid, heptanoic acid, octanoic acid, acrylic acid, methacrylic acid, crotonic acid, vinylacetic acid, hexenoic acid, fumaric acid, phenylacetic acid, phenylpropionic acid, triphenylacetic acid, cinnamic acid, benzoic acid, trimellitic acid, and pyromellitic acid are preferred. The amount of the organic acid to be blended in is 0.5 to 5.0 parts by mass, per 100 parts by mass of the condensation product (polytitanoxane, polyorganosiloxane, copolymer, or a combination thereof).

As the water to be blended in, pure water, ultrapure water, ion-exchanged water, or the like can be used and the blended amount thereof can be 1 to 20 part(s) by mass, per 100 parts by mass of the thin film forming composition.

The thin film forming composition used for a lithography process of the present invention may contain a β-diketone and/or a β-ketoester. The β-diketone and/or the β-ketoester may be used as a part of a solvent shown below.

Examples of the β-diketone and/or the β-ketoester include acetylacetone, methyl acetoacetate, ethyl acetoacetate, n-propyl acetoacetate, isopropyl acetoacetate, n-butyl acetoacetate, isobutyl acetoacetate, sec-butyl acetoacetate, tert-butyl acetoacetate, 2,4-hexanedion, 2,4-pentanedion, 2,4-heptanedion, 3,5-heptanedion, 2,4-octanedion, 3,5-octanedion, 2,4-nonanedion, 3,5-nonanedion, and 5-methyl-2,4-hexanedion. Among these compounds, acetylacetone and ethyl acetoacetate are preferred. These components may be used individually or in combination of two or more of them. The β-diketone and/or the β-ketoester can be used in an amount of 1 to 2,000 parts by mass, or 10 to 500 parts by mass, per 100 parts by mass of the condensation product (polytitanoxane, polyorganosiloxane, copolymer, or a combination thereof).

In the thin film forming composition used for a lithography process of the present invention, a complex compound that forms a complex with titanium or silicon can be blended. Examples of the complex compound include allyl alcohol.

As an additive, bisphenol S or a bisphenol S derivative can be blended in the composition. The amount of bisphenol S or a bisphenol S derivative is 0.01 to 20 parts by mass, or 0.01 to 10 parts by mass, or 0.01 to 5 parts by mass, per 100 parts by mass of the condensation product (polytitanoxane, polyorganosiloxane, copolymer, or a combination thereof).

Preferred examples of bisphenol S or a bisphenol S derivative include the compounds below.

Formula (D-1)
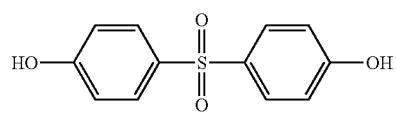

Formula (D-2)
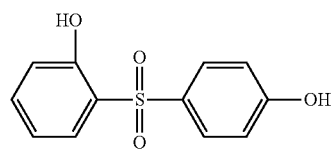

Formula (D-3)
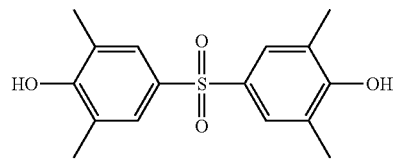

Formula (D-4)
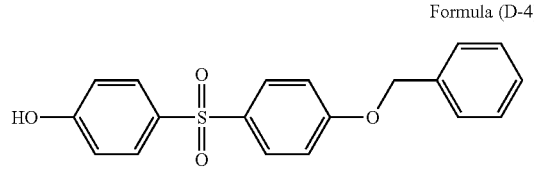

Formula (D-5)
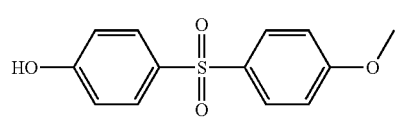

Formula (D-6)
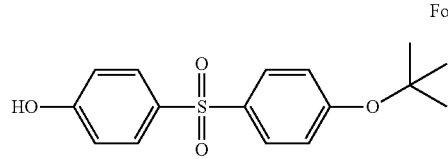

Formula (D-7)
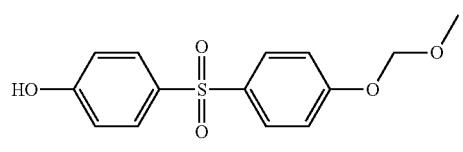

Formula (D-8)
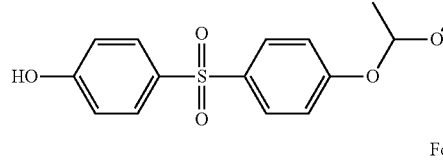

Formula (D-9)
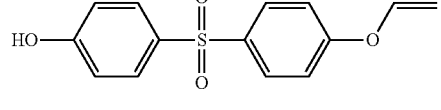

-continued

Formula (D-10)
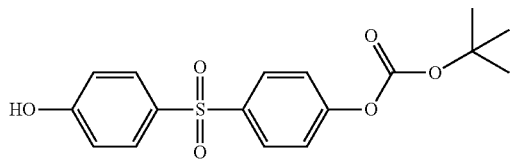

Formula (D-11)
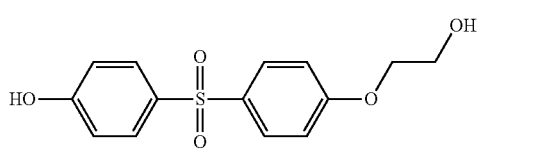

Formula (D-12)
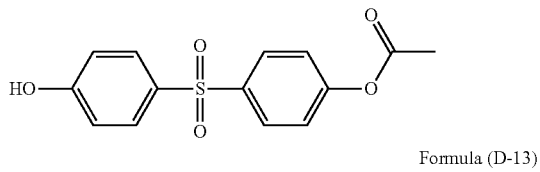

Formula (D-13)
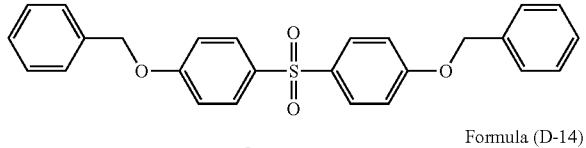

Formula (D-14)
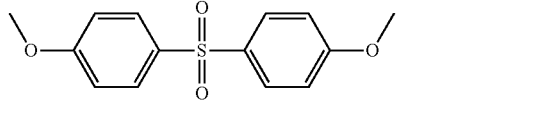

Formula (D-15)
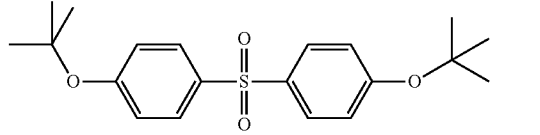

Formula (D-16)
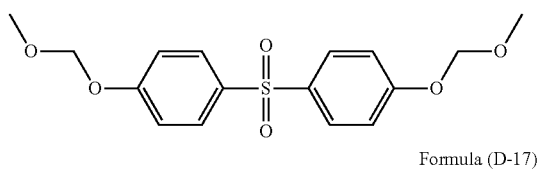

Formula (D-17)
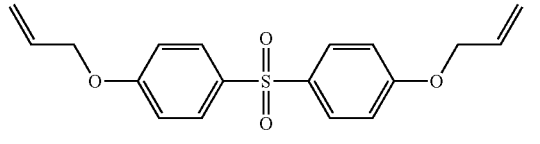

Formula (D-18)
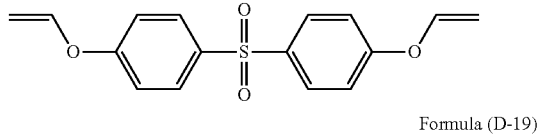

Formula (D-19)

-continued

Formula (D-20)

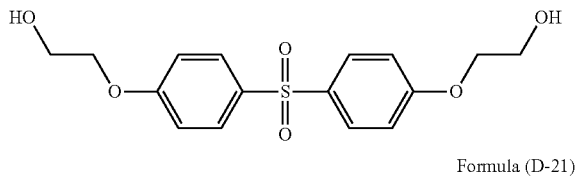

Formula (D-21)

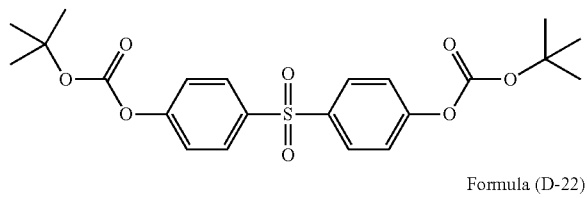

Formula (D-22)

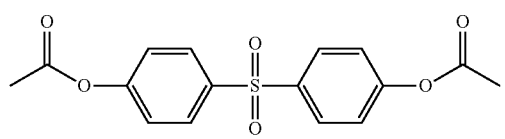

Formula (D-23)

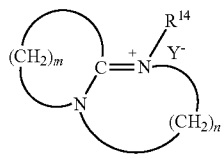

The thin film forming composition of the present invention may contain a salt. The salt performs a function as a curing catalyst when the coating film containing the condensation product (polytitanoxane, polyorganosiloxane, copolymer, or a combination thereof) is heated to be cured.

As the salt, there can be used ammonium salts, phosphines, phosphonium salts, and sulfonium salts.

Examples of the ammonium salt include: quaternary ammonium salts having a structure of Formula (E-1):

Formula (E-1)

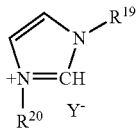

(where m is 2 to 11; n is an integer of 2 to 3; $R^{14}$ is an alkyl group or an aryl group;
and $Y^-$ is an anion);
quaternary ammonium salts having a structure of Formula (E-2):

$$R^{15}R^{16}R^{17}R^{18}N^+Y^-$$  Formula (E-2)

(where $R^{15}$, $R^{16}$, $R^{17}$, and $R^{18}$ are independently an alkyl group or an aryl group; N is a nitrogen atom; $Y^-$ is an anion; and $R^{15}$, $R^{16}$, $R^{17}$, and $R^{18}$ are independently bonded to a nitrogen atom through a C—N bond);

quaternary ammonium salts having a structure of Formula (E-3):

Formula (E-3)

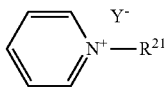

(where $R^{19}$ and $R^{20}$ are independently an alkyl group or an aryl group; and $Y^-$ is an anion);
quaternary ammonium salts having a structure of Formula (E-4):

Formula (E-4)

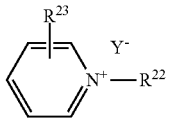

(where $R^{21}$ is an alkyl group or an aryl group; and $Y^-$ is an anion); quaternary ammonium salts having a structure of Formula (E-5):

Formula (E-5)

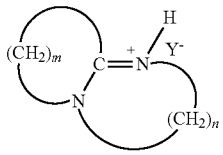

(where $R^{22}$ and $R^{23}$ are independently an alkyl group or an aryl group; and $Y^-$ is an anion); and
tertiary ammonium salts having a structure of Formula (E-6):

Formula (E-6)

(CH₂)ₘ   C=N   Y⁻   (CH₂)ₙ   H (where m is 2 to 11; n is an integer of 2 to 3; H is a hydrogen atom; and $Y^-$ is an anion).

Examples of the phosphonium salt include quaternary phosphonium salts having a structure of Formula (E-7):

$$R^{24}R^{25}R^{26}R^{27}P^+Y^-$$  Formula (E-7)

(where $R^{24}$, $R^{25}$, $R^{26}$ and $R^{27}$ are independently an alkyl group or an aryl group; P is a phosphorus atom; $Y^-$ is an anion; and $R^{24}$, $R^{25}$, $R^{26}$ and $R^{27}$ are independently bonded to a phosphorus atom through a C—P bond).

Examples of the sulfonium salt include tertiary sulfonium salts of Formula (E-8):

$$R^{28}R^{29}R^{30}S^+Y^-$$  Formula (E-8)

(where $R^{28}$, $R^{29}$, and $R^{30}$ are independently an alkyl group or an aryl group; S is a sulfur atom; $Y^-$ is an anion; and $R^{28}$, $R^{29}$, and $R^{30}$ are independently bonded to a sulfur atom through a C—S bond).

The compound of Formula (E-1) is a quaternary ammonium salt derived from an amine and in Formula (E-1), m is 2 to 11 and n is an integer of 2 to 3. $R^{14}$ of the quaternary ammonium salt is a $C_{1-18}$ alkyl group or aryl group, preferably a $C_{2-10}$ alkyl group or aryl group and examples thereof include: linear alkyl groups such as an ethyl group, a propyl group, and a butyl group; a benzyl group; a cyclohexyl group; a cyclohexylmethyl group; and a dicyclopentadienyl group.

Examples of the anion ($Y^-$) include: halogen ions such as a chlorine ion ($Cl^-$), a bromine ion ($Br^-$), and an iodine ion ($I^-$); and acid groups such as carboxylato ($-COO^-$), sulfonato ($-SO_3^-$), and alcoholate ($-O^-$).

The compound of Formula (E-2) is a quaternary ammonium salt of $R^{15}R^{16}R^{17}R^{18}N^+Y^-$. $R^{15}$, $R^{16}$, $R^{17}$, and $R^{18}$ of the quaternary ammonium salt are independently a $C_{1-18}$ alkyl group or aryl group, or a silane compound bonded to a silicon atom through a Si—C bond.

Examples of the anion ($Y^-$) include: halogen ions such as a chlorine ion ($Cl^-$), a bromine ion ($Br^-$), and an iodine ion ($I^-$); and acid groups such as carboxylato ($-COO^-$), sulfonato ($-SO_3^-$), and alcoholate ($-O^-$).

The quaternary ammonium salt is commercially available and examples thereof include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (E-3) is a quaternary ammonium salt derived from a 1-substituted imidazole and in Formula (E-3), $R^{19}$ and $R^{20}$ are independently a $C_{1-18}$ alkyl group or aryl group. The sum of the numbers of carbon atoms of $R^{19}$ and $R^{20}$ is preferably 7 or more. Examples of $R^{19}$ include a methyl group, an ethyl group, a propyl group, a phenyl group, and a benzyl group and examples of $R^{20}$ include a benzyl group, an octyl group, and an octadecyl group.

Examples of the anion ($Y^-$) include: halogen ions such as a chlorine ion ($Cl^-$), a bromine ion ($Br^-$), and an iodine ion ($I^-$); and acid groups such as carboxylato ($-COO^-$), sulfonato ($-SO_3^-$), and alcoholate ($-O^-$).

The compound either is commercially available or can be produced, for example, by reacting an imidazole-based compound such as 1-methylimidazole and 1-benzylimidazole with a halogenated alkyl or halogenated aryl such as benzyl bromide and methyl bromide.

The compound of Formula (E-4) is a quaternary ammonium salt derived from pyridine and in Formula (E-4), $R^{21}$ is a $C_{1-18}$ alkyl group or aryl group, preferably a $C_{4-18}$ alkyl group or aryl group and examples thereof include a butyl group, an octyl group, a benzyl group, and a lauryl group.

Examples of the anion ($Y^-$) include: halogen ions such as a chlorine ion ($Cl^-$), a bromine ion ($Br^-$), and an iodine ion ($I^-$); and acid groups such as carboxylato ($-COO^-$), sulfonato ($-SO_3^-$), and alcoholate ($-O^-$).

The compound either is commercially available or can be produced, for example, by reacting pyridine with a halogenated alkyl or halogenated aryl such as lauryl chloride, benzyl chloride, benzyl bromide, methyl bromide, and octyl bromide. Examples of the compound include N-laurylpyridinium chloride and N-benzylpyridinium bromide.

The compound of Formula (E-5) is a quaternary ammonium salt derived from a substituted pyridine represented by picoline and the like and in Formula (E-5), $R^{22}$ is a $C_{1-18}$ alkyl group or aryl group, preferably a $C_{4-18}$ alkyl group or aryl group and examples thereof include a methyl group, an octyl group, a lauryl group, and a benzyl group. $R^{23}$ is a $C_{1-18}$ alkyl group or aryl group and for example, when the compound is a quaternary ammonium derived from picoline, $R^{23}$ is a methyl group.

Examples of the anion ($Y^-$) include: halogen ions such as a chlorine ion ($Cl^-$), a bromine ion ($Br^-$), and an iodine ion ($I^-$); and acid groups such as carboxylato ($-COO^-$), sulfonato ($-SO_3$), and alcoholate ($-O^-$).

The compound either is commercially available or can be produced, for example, by reacting a substituted pyridine such as picoline with a halogenated alkyl or a halogenated aryl such as methyl bromide, octyl bromide, lauryl chloride, benzyl chloride, and benzyl bromide. Examples of the compound include N-benzylpicolinium chloride, N-benzylpicolinium bromide, and N-laurylpicolinium chloride.

The compound of Formula (E-6) is a tertiary ammonium salt derived from an amine and in Formula (E-6), m is 2 to 11 and n is an integer of 2 to 3.

Examples of the anion ($Y^-$) include: halogen ions such as a chlorine ion ($Cl^-$), a bromine ion ($Br^-$), and an iodine ion ($I^-$); and acid groups such as carboxylato ($-COO^-$), sulfonato ($-SO_3^-$), and alcoholate ($-O^-$).

The compound can be produced by a reaction of an amine with a weak acid such as a carboxylic acid and phenol.

Examples of the carboxylic acid include formic acid and acetic acid. When formic acid is used, the anion ($Y^-$) is ($HCOO^-$) and when acetic acid is used, the anion ($Y^-$) is ($CH_3COO^-$). In addition, when phenol is used, the anion ($Y^-$) is ($C_6H_5O^-$).

The compound of Formula (E-7) is a quaternary phosphonium salt having a structure of $R^{24}R^{25}R^{26}R^{27}P^+Y^-$. $R^{24}$, $R^{25}$, $R^{26}$, and $R^{27}$ are independently a $C_{1-18}$ alkyl group or aryl group, or a silane compound bonded to a silicon atom through a Si—C bond. Preferably, three groups among four substituents of $R^{11}$ to $R^{14}$ are a phenyl group or a substituted phenyl group such as a phenyl group and a tolyl group and the residual one group is a $C_{1-18}$ alkyl group or aryl group, or a silane compound bonded to a silicon atom through a Si—C bond.

Examples of the anion ($Y^-$) include: halogen ions such as a chlorine ion ($Cl^-$), a bromine ion ($Br^-$), and an iodine ion ($I^-$); and acid groups such as carboxylato ($-COO^-$), sulfonato ($-SO_3^-$), and alcoholate ($-O^-$).

The compound is commercially available and examples of the compound include: halogenated tetraalkylphosphoniums such as a halogenated tetra-n-butylphosphonium and a halogenated tetra-n-propylphosphonium; halogenated trialkylbenzylphosphoniums such as a halogenated triethylbenzylphosphonium; halogenated triphenylmonoalkylphosphoniums such as a halogenated triphenylmethylphosphonium and a halogenated triphenylethylphosphonium; halogenated triphenylbenzylphosphoniums; halogenated tetraphenylphosphoniums; halogenated tritolylmonoarylphosphoniums; and halogenated tritolylmonoalkylphosphoniums (where the halogen atom is a chlorine atom or a bromine atom). Particularly preferred examples of the compound include: halogenated triphenylmonoalkylphosphoniums such as a halogenated triphenylmethylphosphonium and a halogenated triphenylethylphosphonium; halogenated triphenylmonoarylphosphoniums such as a halogenated triphenylbenzylphosphonium; halogenated tritolylmonoarylphosphoniums such as a halogenated tritolylmonophenylphosphonium; and halogenated tritolylmonoalkylphosphoniums such as a halogenated tritolylmonomethylphosphonium (where the halogen atom is a chlorine atom or a bromine atom).

Examples of the phosphines include: primary phosphines such as methylphosphine, ethylphosphine, propylphosphine, isopropylphosphine, isobutylphosphine, and phenylphosphine; secondary phosphines such as dimethylphosphine, diethylphosphine, diisopropylphosphine, diisoamylphosphine, and diphenylphosphine; and tertiary phosphines such as trimethylphosphine, triethylphosphine, triphenylphosphine, methyldiphenylphosphine, and dimethylphenylphosphine.

The compound of Formula (E-8) is a tertiary sulfonium salt having a structure of $R^{28}R^{29}R^{30}S^+Y^-$. $R^{28}$, $R^{29}$, and $R^{30}$ are independently a $C_{1-18}$ alkyl group or aryl group, or a silane compound bonded to a silicon atom through a Si—C bond. Preferably, three groups among four substituents of $R^{15}$ to $R^{17}$ are a phenyl group or a substituted phenyl group such as a phenyl group and a tolyl group and the residual one group is a $C_{1-18}$ alkyl group or aryl group. Examples of the anion ($Y^-$) include: halogen ions such as a chlorine ion ($Cl^-$), a bromine ion ($Br^-$), and an iodine ion ($I^-$); and acid groups such as carboxylato (—COO$^-$), sulfonato (—SO$_3^-$), and alcoholate (—O$^-$).

The compound is commercially available and examples of the compound include: halogenated tetraalkylsulfoniums such as a halogenated tri-n-butylsulfonium and a halogenated tri-n-propylsulfonium; halogenated trialkylbenzylsulfoniums such as a halogenated diethylbenzylsulfonium; halogenated diphenylmonoalkylsulfoniums such as a halogenated diphenylmethylsulfonium and a halogenated diphenylethylsulfonium; halogenated triphenylsulfoniums (regarding the compounds described above, the halogen atom is a chlorine atom or a bromine atom); tetraalkylphosphonium carboxylates such as tri-n-butylsulfonium carboxylate and tri-n-propylsulfonium carboxylate; trialkylbenzylsulfonium carboxylates such as diethylbenzylsulfonium carboxylate; diphenylmonoalkylsulfonium carboxylates such as diphenylmethylsulfonium carboxylate and diphenylethylsulfonium carboxylate; and triphenylsulfonium carboxylate. Particularly preferred are halogenated triphenylsulfonium and triphenylsulfonium carboxylate.

The amount of the salt is 0.01 to 10 parts by mass, or 0.01 to 5 parts by mass, or 0.01 to 3 parts by mass, per 100 parts by mass of the condensation product (polytitanoxane, polyorganosiloxane, copolymer, or a combination thereof).

The thin film forming composition used for a lithography process of the present invention may contain, besides the components described above, if necessary, organic polymer compounds, photoacid generators, surfactants, and the like.

By using an organic polymer compound, there can be controlled the dry etching rate (a decreased amount of the film thickness per unit time), the attenuation coefficient, the refractive index, and the like of the thin film formed from the thin film forming composition used for a lithography process of the present invention.

The organic polymer compound is not particularly limited and various organic polymers such as condensation polymerization polymers and addition polymerization polymers can be used. As the organic polymer compound, there can be used addition polymerization polymers and condensation polymerization polymers such as polyesters, polystyrenes, polyimides, acrylic polymers, methacrylic polymers, polyvinylethers, phenolnovolacs, naphtholnovolacs, polyethers, polyamides, and polycarbonates.

In particular, there are preferably used organic polymers having an aromatic ring structure functioning as a light absorbing moiety such as a benzene ring, a naphthalene ring, an anthracene ring, a triazine ring, a quinoline ring, and a quinoxaline ring.

Examples of such an organic polymer compound include addition polymerization polymers containing as a structure unit thereof, an addition polymerizable monomer such as benzylacrylate, benzylmethacrylate, phenylacrylate, naphthylacrylate, anthrylmethacrylate, anthrylmethylmethacrylate, styrene, hydroxystyrene, benzylvinyl ether, and N-phenylmaleimide, and condensation polymerization polymers such as phenolnovolacs and naphtholnovolacs.

When an addition polymerization polymer is used as the organic polymer compound, the polymer compound may be either a homopolymer or a copolymer. For producing the addition polymerization polymer, an addition polymerizable monomer is used. Examples of such an addition polymerizable monomer include acrylic acid, methacrylic acid, acrylic acid ester compounds, methacrylic acid ester compounds, acrylamide compounds, methacrylamide compounds, vinyl compounds, styrene compounds, maleimide compounds, maleic anhydride, and acrylonitrile.

Examples of the acrylic acid ester compound include methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic acid ester compound include methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, and N-anthrylmethacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyltrimethoxysilane, 2-chloroethyl vinyl ether, 2-methoxyethyl vinyl ether, vinylnaphthalene, and vinylanthracene.

Examples of the styrene compound include styrene, hydroxystyrene, chlorostyrene, bromostyrene, methoxystyrene, cyanostyrene, and acetylstyrene.

Examples of the maleimide compound include maleimide, N-methylmaleimide, N-phenylmaleimide, N-cyclohexylmaleimide, N-benzylmaleimide, and N-hydroxyethylmaleimide.

When a condensation polymerization polymer is used as the organic polymer compound, examples of such an organic polymer include condensation polymerization polymers of a glycol compound and a dicarboxylic acid compound.

Examples of the glycol compound include diethylene glycol, hexamethylene glycol, and butylene glycol.

Examples of the dicarboxylic acid compound include succinic acid, adipic acid, terephthalic acid, and maleic anhydride.

Examples of the condensation polymerization polymer include polyesters, polyamides, and polyimides such as polypyromellitimide, poly(p-phenyleneterephthalamide), polybutyleneterephthalate, and polyethyleneterephthalate.

When the organic polymer compound contains a hydroxy group, the hydroxy group can effect a crosslinking reaction with a polyorganosiloxane.

As the organic polymer compound, there can be used a polymer compound having a weight average molecular weight of, for example, 1,000 to 1,000,000, or 3,000 to 300,000, or 5,000 to 200,000, or 10,000 to 100,000.

The organic polymer compounds may be used individually or in combination of two or more of them.

When the organic polymer compound is used, the content thereof is 1 to 200 part(s) by mass, or 5 to 100 parts by mass, or 10 to 50 parts by mass, or 20 to 30 parts by mass, per 100 parts by mass of the condensation product (polytitanoxane, polyorganosiloxane, copolymer, or a combination thereof).

The thin film forming composition of the present invention may contain an acid generator.

Examples of the acid generator include thermoacid generators and photoacid generators.

The photoacid generator generates an acid during exposure of the resist. Therefore, the acidity of the underlayer film can be controlled. This is one method for adjusting the acidity of the underlayer film to that of the resist as an upper layer of the underlayer film. By adjusting the acidity of the underlayer film, the pattern shape of the resist formed in the upper layer can be controlled.

Examples of the photoacid generator contained in the thin film forming composition of the present invention include onium salt compounds, sulfonimide compounds, and disulfonyl diazomethane compounds.

Examples of the onium salt compound include: iodonium salt compounds such as diphenyliodoniumhexafluorophosphate, diphenyliodoniumtrifluoromethanesulfonate, diphenyliodoniumnonafluoro normal butane sulfonate, diphenyliodoniumperfluoro normal octane sulfonate, diphenyliodoniumcamphorsulfonate, bis(4-tert-butylphenyl)iodoniumcamphorsulfonate, and bis(4-tert-butylphenypiodoniumtrifluoromethanesulfonate; and sulfonium salt compounds such as triphenylsulfoniumhexafluoroantimonate, triphenylsulfoniumnonafluoro normal butane sulfonate, triphenylsulfoniumcamphorsulfonate, and triphenylsulfoniumtrifluoromethanesulfonate.

Examples of the sulfonimide compound include N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

These photoacid generators may be used individually or in combination of two or more of them.

When the photoacid generator is used, the content thereof is 0.01 to 5 parts by mass, or 0.1 to 3 parts by mass, or 0.5 to 1 part(s) by mass, per 100 parts by mass of the condensation product (polytitanoxane, polyorganosiloxane, copolymer, or a combination thereof).

The surfactant is effective for suppressing the formation of a pin hole, a striation, and the like when the thin film forming composition of the present invention is applied onto a substrate.

Examples of the surfactant contained in the thin film forming composition of the present invention include: nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example, EFTOP EF301, EF303, and EF352 (trade name; manufactured by Tohkem Products Corp.), MEGAFAC F171, F173, R-08, and R-30 (trade name; manufactured by Dainihon Ink & Chemicals Inc.), Fluorad FC430 and FC431 (trade name; manufactured by Sumitomo 3M Limited), AsahiGuard AG710 and Surflon S-382, SC101, SC102, SC103, SC104, SC105, and SC106 (trade name; manufactured by Asahi Glass Co., Ltd.); and Organosiloxane polymer KP341 (manufactured by Shin-Etsu Chemical Co., Ltd.).

These surfactants may be used individually or in combination of two or more of them. When the surfactant is used, the content thereof is 0.0001 to 5 parts by mass, or 0.001 to 3 parts by mass, or 0.01 to 0.5 parts by mass, per 100 parts by mass of the condensation product (polytitanoxane, polyorganosiloxane, copolymer, or a combination thereof).

In the thin film forming composition of the present invention, a rheology controlling agent and an adhesion assistant may be blended. The rheology controlling agent is effective for enhancing the fluidity of the thin film forming composition. The adhesion assistant is effective for enhancing the adhesion of the thin film to the semiconductor substrate or the resist.

The solvent used for the thin film forming composition of the present invention is not particularly limited so long as the solvent can dissolve the solid content. Examples of such a solvent include methanol, ethanol, propanol, isopropanol, butanol, methyl cellosolve acetate, ethyl cellosolve acetate, propylene glycol, propylene glycol monomethyl ether, propylene glycol monoethyl ether, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, methyl isobutyl carbinol, and γ-butyrolactone.

These solvents may be used individually or in combination of two or more of them.

The thin film forming composition of the present invention can be utilized as a resist underlayer film forming composition for a photoresist, a resist underlayer film forming composition for an EUV resist, an EUV resist upper layer film forming composition, a reverse material forming composition, an underlayer film forming composition for a resist for solvent development, and the like.

Hereinafter, the case where the thin film forming composition of the present invention is used as a resist underlayer film forming composition is described.

The thin film forming composition (resist underlayer film forming composition) of the present invention is applied onto a substrate used in the production of semiconductor devices (for example, silicon wafer substrates, silicon/silicon dioxide coated substrates, silicon nitride substrates, glass substrates, ITO substrates, polyimide substrates, and low dielectric constant material (low-k material) coated substrates) by an appropriate coating method such as a spinner and a coater and then, is baked to form a thin film (resist underlayer film).

The baking conditions are accordingly selected from baking temperatures of 80° C. to 500° C. or 80° C. to 250° C. and baking time of 0.3 to 60 minutes. Preferably, the baking temperature is 150° C. to 500° C. and the baking time is 0.5 to 2 minutes.

Here, the formed thin film (resist underlayer film) has a film thickness of for example, 10 to 1,000 nm, or 20 to 500 nm, or 50 to 300 nm, or 100 to 200 nm, or 10 to 100 nm.

Next, on the thin film (resist underlayer film), for example a photoresist layer (film) is formed. The formation of the photoresist layer can be performed by a known method, that is, by applying a photoresist composition solution onto the underlayer film and by baking the composition solution.

The photoresist layer has a film thickness of, for example, 50 to 10,000 nm, or 100 to 2,000 nm, or 200 to 1,000 nm, or 30 to 200 nm.

In the present invention, after forming of the organic underlayer film on the substrate, the thin film (resist underlayer film) of the present invention can be film-formed on the organic underlayer film and further, the thin film (resist underlayer film) can be coated with the photoresist layer. Thus, even when the pattern width of the photoresist layer is smaller and the photoresist layer is coated thinly for preventing a pattern collapse, the processing of the substrate is possible by selecting an appropriate etching gas.

For example, the thin film (resist underlayer film) of the present invention can be processed by using as an etching gas, a fluorine-based gas having an etching rate of the thin film (resist underlayer film) satisfactorily higher than that of the photoresist, and the organic underlayer film can be processed by using an oxygen-based gas having an etching rate of the organic underlayer film satisfactorily higher than that of the thin film (resist underlayer film) of the present invention as an etching gas. Furthermore, the substrate can be processed by using a fluorine-based gas having an etching rate of the substrate satisfactorily higher than that of the organic underlayer film as an etching gas.

The photoresist formed on the thin film (resist underlayer film) of the present invention is not particularly limited so long as the photoresist is sensitive to light used for the exposure, and both a negative-type photoresist and a positive-type photoresist can be used. Examples of the photoresist include: a positive-type photoresist made of a novolac resin and 1,2-naphthoquinonediazide sulfonic acid ester; a chemical amplification-type photoresist made of a binder having a group elevating the alkali dissolving rate by being decomposed by an acid, and a photoacid generator; a chemical amplification-type photoresist made of a low molecule compound elevating the alkali dissolving rate of a photoresist by being decomposed by an acid, an alkali-soluble binder, and a photoacid generator; and a chemical amplification-type photoresist made of a binder having a group elevating the alkali dissolving rate by being decomposed by an acid, a low molecule compound elevating the alkali dissolving rate of a photoresist by being decomposed by an acid, and a photoacid generator. Examples of the photoresist include trade name: APEX-E manufactured by Shipley Company, L.L.C., trade name: PAR710 manufactured by Sumitomo Chemical Co., Ltd., and trade name: SEPR430 manufactured by Shin-Etsu Chemical Co., Ltd. The examples also include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Next, the exposure is performed through a predetermined mask. For the exposure, KrF excimer laser (wavelength: 248 m), ArF excimer laser (wavelength: 193 nm), F2 excimer laser (wavelength: 157 nm), and the like can be used. After the exposure, if necessary, post exposure bake can also be performed. The post exposure bake is performed under conditions accordingly selected from baking temperatures of 70° C. to 150° C. and baking time of 0.3 to 10 minutes.

In the present invention, as the resist, a resist for electron beam lithography or an EUV resist can be used instead of the photoresist. As the electron beam resist, both a positive type and a negative type can be used. Examples of the electron beam resist include: a chemical amplification-type resist made of an acid generator and a binder having a group changing the alkali dissolving rate by being decomposed by an acid; a chemical amplification-type resist made of an alkali-soluble binder, an acid generator, and a low molecule compound changing the alkali dissolving rate of the resist by being decomposed by an acid; a chemical amplification-type resist made of an acid generator and a binder having a group changing the alkali dissolving rate by being decomposed by an acid, and a low molecule compound changing the alkali dissolving rate of the resist by being decomposed by an acid; a non-chemical amplification-type resist made of a binder having a group changing the alkali dissolving rate by being decomposed by an electron beam; and a non-chemical amplification-type resist made of a binder having a moiety changing the alkali dissolving rate by being broken by an electron beam. Also in the case of using the electron beam resist, a resist pattern can be formed in the same manner as in the case of using a photoresist, by using an electron beam as the radiating source.

As the EUV resist, a methacrylate resin-based resist can be used.

Next, development is performed by a developer. Consequently, for example when a positive-type photoresist is used, the photoresist of an exposed part is removed to form a resist pattern.

Examples of the developer include alkaline aqueous solutions such as: aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous solutions of amines such as ethanolamine, propylamine, and ethylenediamine Furthermore, in these developers, a surfactant and the like may also be blended. The conditions for the development are accordingly selected from temperatures of 5 to 50° C. and time of 10 to 600 seconds.

Then, using the thus formed pattern of the photoresist film (upper layer) as a protecting film, the removal of the thin film (resist underlayer film) (intermediate layer) of the present invention is performed. Next, using the film composed of the patterned photoresist and the patterned thin film (resist underlayer film) (intermediate layer) of the present invention as a protecting film, the removal of the organic underlayer film (underlayer) is performed. Finally, using the patterned thin film (resist underlayer film) (intermediate layer) of the present invention and the patterned organic underlayer film (underlayer) as a protecting film, the processing of the semiconductor substrate is performed.

In the above-described method, first, the thin film (resist underlayer film) (intermediate layer) of the present invention at the part where the photoresist is removed is removed by dry etching to expose the semiconductor substrate.

For dry etching the thin film (resist underlayer film) of the present invention, there can be used gases such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, and trichloroborane and dichloroborane.

In particular, by dry etching with a halogen-based gas, fundamentally, a photoresist that is composed of organic substances are difficult to be removed. On the contrary, the thin film (resist underlayer film) of the present invention containing a large amount of silicon atoms is immediately removed by a halogen-based gas, so that dry etching of the resist underlayer film is preferably performed using a halogen-based gas. Herewith, the decrease of the film thickness of the photoresist associated with dry etching of the thin film (resist underlayer film) can be suppressed. Then, as a result thereof, the photoresist can be used as a thin film.

The resist underlayer film can be dry-etched also with a fluorine-based gas. Examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

The titanium-silicon-containing thin film (resist underlayer film) of the present invention is preferably dry-etched with a halogen-based gas and examples of the halogen-based gas include hydrogen bromide (HBr) and chlorine (Cl). By mixing a fluorine-based gas such as $CF_4$ and $CHF_3$ and an oxygen-based gas such as $O_2$ with the halogen-based gas to prepare an etching gas to be used, an etching selection ratio relative to the resist can be obtained.

Subsequently, using the film composed of the patterned photoresist and the patterned thin film (resist underlayer film) of the present invention as a protecting film, the removal of the organic underlayer film is performed. The removal of the organic underlayer film (underlayer) or the organic anti-reflective coating is performed by dry etching preferably with an oxygen-based gas. This is because the thin film (resist underlayer film) of the present invention containing a large amount of silicon atoms is difficult to be removed by dry etching with an oxygen-based gas.

Finally, the processing of the semiconductor substrate is performed. The processing of the semiconductor substrate is performed by dry etching preferably with a fluorine-based gas.

Examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

As an upper layer of the thin film (resist underlayer film) of the present invention, an organic anti-reflective coating can be formed before the formation of the photoresist layer (film). The anti-reflective coating composition used here is not particularly limited and can be optionally selected from the compositions commonly used in a conventional lithography process to be used. The formation of the anti-reflective coating can be performed by a commonly used method, for example, by applying an anti-reflective coating composition by a spinner or a coater and by baking the composition.

The method for producing a semiconductor device of the present invention includes as such a multilayer process, a process of forming an organic underlayer film on a semiconductor substrate, a process of applying the thin film forming composition (resist underlayer film forming composition) of the present invention onto the organic underlayer film and baking the composition to form a thin film (resist underlayer film), a process of applying an organic resist underlayer film forming composition onto the thin film (resist underlayer film) to form an organic resist underlayer film, a process of applying a composition for a resist onto the organic resist underlayer film to form a resist film, a process of exposing the resist film to light, a process of developing the resist film after the exposure to obtain a resist pattern, a process of etching the organic resist underlayer film according to the resist pattern, a process of etching the thin film (resist underlayer film) of the present invention according to the patterned organic resist underlayer film, a process of etching the organic underlayer film according to the patterned thin film (resist underlayer film), and a process of processing the semiconductor substrate according to the patterned organic underlayer film.

The substrate onto which the thin film forming composition (resist underlayer film forming composition) of the present invention is applied may also be a substrate having an organic or inorganic anti-reflective coating formed by a CVD method on its surface and, on the anti-reflective coating, the thin film (resist underlayer film) of the present invention can also be formed.

The thin film (resist underlayer film) formed from the thin film forming composition (resist underlayer film forming composition) of the present invention may absorb a light used in a lithography process depending on the wavelength of the light. Then, in such a case, the thin film (resist underlayer film) can function as an anti-reflective coating having the effect of preventing a light reflected on the substrate.

Furthermore, the thin film (resist underlayer film) of the present invention can also be used as a layer for preventing an interaction between the substrate and the photoresist, a layer having a function of preventing an adverse action of a material used in the photoresist or of a substance generated during exposure of the photoresist against the substrate, a layer having a function of preventing the diffusion of a substance generated in or on the substrate during heating and baking to the upper layer photoresist, a barrier layer for reducing a poisoning effect to the photoresist layer by a semiconductor substrate dielectric layer, and the like.

The thin film (resist underlayer film) formed from the thin film forming composition (resist underlayer film forming composition) of the present invention can be applied onto a substrate in which a via hole used in the dual damascene process is formed to be used as an embedding material capable of filling the hole without any void. The thin film (resist underlayer film) can also be used as a planarizing material for planarizing the surface of a semiconductor substrate having unevenness.

Hereinafter, the case where the thin film forming composition of the present invention is used as an EUV resist upper layer film forming composition or an EUV resist underlayer film forming composition, is described.

As the EUV resist applied as an underlayer of the EUV resist upper layer film of the present invention, both a positive type and a negative type can be used. Examples of the EUV resist include: a chemical amplification-type resist made of an acid generator and a binder having a group changing the alkali dissolving rate by being decomposed by an acid; a chemical amplification-type resist made of an alkali-soluble binder, an acid generator, and a low molecule compound changing the alkali dissolving rate of the resist by being decomposed by an acid; a chemical amplification-type resist made of an acid generator and a binder having a group changing the alkali dissolving rate by being decomposed by an acid, and a low molecule compound changing the alkali dissolving rate of the resist by being decomposed by an acid; a non-chemical amplification-type resist made of a binder having a group changing the alkali dissolving rate by being decomposed by EUV; and a non-chemical amplification-type resist made of a binder having a moiety changing the alkali dissolving rate by being broken by EUV.

Examples of the developer for a positive-type resist having the thin film (resist upper layer film) formed by using the thin film forming composition (EUV resist upper layer film forming composition) of the present invention include aqueous solutions of alkalis such as: inorganic alkalis such as sodium hydroxide, potassium hydroxide, sodium carbonate, sodium silicate, sodium metasilicate, and ammonia water; primary amines such as ethylamine and n-propylamine; secondary amines such as diethylamine and di-n-butyl amine; tertiary amines such as triethylamine and methyldiethylamine; alcoholamines such as dimethylethanolamine and triethanolamine; quaternary ammonium salts such as tetramethylammonium hydroxide, tetraethylammonium hydroxide, and choline; cyclic amines such as pyrrole and piperidine. Further, an appropriate amount of alcohols such as isopropyl alcohol and a surfactant such as a nonionic surfactant may be added to the above aqueous solution of alkalis to be used as the developer.

Among them, a preferred developer is quaternary ammonium salts and a further preferred developer is tetramethylammonium hydroxide and choline.

The method for producing a semiconductor device of the present invention includes: a process of forming an EUV resist film on a substrate having a processing-objective film in which a transferred pattern is formed with or without using an EUV resist underlayer film; a process of applying an EUV resist upper layer film forming composition onto the resist film and baking the composition to form an EUV resist upper layer film; a process of exposing the semiconductor substrate coated with the resist upper layer film and the resist film; and a process of performing development after the exposure to remove the resist upper layer film and the resist film.

The exposure is performed with EUV (wavelength 13.5 nm).

A semiconductor device to which the thin film forming composition (EUV resist upper layer film forming composition) of the present invention is applied, has a constitution in which on the substrate, the processing-objective film to which the pattern is transferred, the resist film, and the thin film (EUV resist upper layer film) are formed in this order. The thin film (EUV resist upper layer film) can form a resist pattern having an advantageous straight shape by reducing adverse effects caused by a foundation substrate or EUV to obtain a satisfactory margin relative to an EUV irradiation dose. The thin film (EUV resist upper layer film) of the present invention has the same large wet etching rate as that of the resist film formed as the underlayer of the thin film and by a wet etching process, the resist pattern can be easily transferred to the processing-objective foundation film.

The thin film forming composition (EUV resist underlayer film forming composition) of the present invention can be used as an EUV resist underlayer anti-reflective coating capable of preventing a reflection of exposure light undesirable during EUV exposure such as UV and DUV on the substrate or the interface as an underlayer film of an EUV resist without causing intermixing with the EUV resist. The thin film forming composition of the present invention can efficiently prevent the reflection as an underlayer of the EUV resist. When the thin film forming composition of the present invention is used as the EUV resist underlayer film, the process can be performed in the same manner as in the case of an underlayer film for a photoresist.

The thin film formed from the thin film forming composition of the present invention can be used as a reverse material. That is, the thin film of the present invention can be used in a method for producing a semiconductor device comprising: a process of forming a resist pattern on a substrate; a process of applying the thin film forming composition of the present invention onto the substrate on which the resist pattern is formed and baking the composition to form a thin film; a process of etching the thin film to expose the resist surface; and a process of etching the resist pattern to reverse the pattern.

The method for using the thin film forming composition of the present invention as an underlayer film for a resist for solvent development, is described.

Onto the substrate, the thin film forming composition of the present invention is applied by an appropriate coating method such as a spinner and a coater and then, the composition is baked to form a thin film. Before the substrate is coated with the thin film of the present invention, on the substrate, an organic underlayer film is formed and on the organic underlayer film, the thin film can be formed.

The photoresist formed on the thin film (resist underlayer film) of the present invention is not particularly limited so long as the photoresist is sensitive to light used for exposure of ArF light and the like. Both a negative-type photoresist and a positive-type photoresist can be used. A photoresist capable of being developed by an organic solvent after exposure can be used.

As the condition for baking, the above-described conditions can be applied.

Next, on the thin film, for example, the above photoresist layer (film) is formed.

In the present invention, as the resist, a resist for EUV lithography or a resist for electron beam lithography can be used instead of the photoresist. As the resist for EUV lithography or the resist for electron beam lithography, both a positive type and a negative type can be used. As the exposure condition, the above-described conditions can be used. A resist capable of being developed by an organic solvent after exposure can be used.

Next, development is performed using a developer (organic solvent). In the development, when, for example, a positive-type photoresist is used, the photoresist at an unexposed part is removed to form a resist pattern.

Examples of the developer include methyl acetate, butyl acetate, ethyl acetate, isopropyl acetate, amyl acetate, isoamyl acetate, ethyl methoxyacetate, ethyl ethoxyacetate, 2-heptanone, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Then, as the developer, butyl acetate, 2-heptanone, and the like can be preferably used.

Furthermore, in these developers, a surfactant and the like may also be blended. The conditions for the development are accordingly selected from temperatures of 5 to 50° C. and time of 10 to 600 seconds.

Then, using the thus formed pattern of the photoresist film (upper layer) as a protecting film, the removal of the thin film (intermediate layer) of the present invention is performed. Next, using the film composed of the patterned photoresist and the patterned thin film (intermediate layer) of the present invention as a protecting film, the removal of the organic underlayer film (underlayer) is performed. Finally, using the patterned thin film (intermediate layer) of the present invention and the patterned organic underlayer film (underlayer) as a protecting film, the processing of the semiconductor substrate is performed.

First, the thin film (intermediate layer) of the present invention at the part where the photoresist is removed is removed by dry etching to expose the semiconductor substrate.

For dry etching the thin film of the present invention, there can be used gases such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, and trichloroborane and dichloroborane.

In particular, by dry etching with a halogen-based gas, fundamentally, a photoresist that is composed of organic substances is difficult to be removed. On the contrary, the thin film of the present invention containing a large amount of silicon atoms is immediately removed by a halogen-based gas, so that dry etching of the thin film of the present invention is preferably performed using a halogen-based gas. Herewith, the decrease of the film thickness of the photoresist associated with dry etching of the thin film can be suppressed. Then, as a result thereof, the photoresist can be used as a thin film.

The thin film of the present invention is preferably dry-etched with a fluorine-based gas. Examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

Subsequently, using the film composed of the patterned photoresist and the patterned thin film of the present invention as a protecting film, the removal of the organic underlayer film is performed. The removal of the organic underlayer film (underlayer) is performed by dry etching preferably with an oxygen-based gas. This is because the thin film of the present invention containing a large amount of silicon atoms is difficult to be removed by dry etching with an oxygen-based gas.

Finally, the processing of the semiconductor substrate is performed. The processing of the semiconductor substrate is performed by dry etching preferably with a fluorine-based gas.

Examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

As an upper layer of the thin film of the present invention, an organic anti-reflective coating can be formed before the formation of the photoresist layer (film). The anti-reflective coating composition used here is not particularly limited and can be optionally selected from the compositions commonly used in a conventional lithography process to be used. The formation of the anti-reflective coating can be performed by a commonly used method, for example, by applying an anti-reflective coating composition by a spinner or a coater and by baking the composition.

In the present invention, after forming of the organic underlayer film on the substrate, the thin film of the present invention can be film-formed on the organic underlayer film and further, the thin film can be coated with the photoresist layer. Thus, even when the pattern width of the photoresist is smaller and the photoresist layer is coated thinly for preventing a pattern collapse, the processing of the substrate is possible by selecting an appropriate etching gas.

For example, the thin film of the present invention can be processed by using a fluorine-based gas having an etching rate of the thin film satisfactorily higher than that of the photoresist as an etching gas, and the organic underlayer film can be processed by using an oxygen-based gas having an etching rate of the organic underlayer film satisfactorily higher than that of the thin film of the present invention as an etching gas. Furthermore, the substrate can be processed by using a fluorine-based gas having an etching rate of the substrate satisfactorily higher than that of the organic underlayer film as an etching gas.

EXAMPLE

Synthesis Example 1

18.60 g (70 mol %) of tetraisobutoxytitanium, 3.48 g (25 mol %) of methyltriethoxysilane, 1.62 g (5 mol %) of 3-(triethoxysilylpropyl)diallylisocyanurate, 35.55 g of acetone, and 35.55 g of acetylacetone were charged into a 300-mL flask and while the reaction mixture solution was stirred with a magnetic stirrer, 5.21 g of a 0.01-mol/L hydrochloric acid was dropped into the reaction mixture solution. After the dropping, the flask was placed into an oil bath controlled to 85° C. and under warming-reflux, the reaction was effected for 240 minutes. Then, the reaction solution was cooled down to room temperature and to the reaction solution, 48.00 g of acetylacetone was added. From the resultant reaction mixture, ethanol, which was a reaction by-product, acetone, isobutanol, water, and hydrochloric acid were distilled off under reduced pressure and the resultant reaction mixture was concentrated to obtain a hydrolysis-condensation product (polymer) acetylacetone solution. To the obtained solution, acetylacetone and propylene glycol monoethyl ether were added to adjust the resultant solution to have a solid residue concentration at 140° C. of 15% by mass while a solvent ratio of acetylacetone/propylene glycol monoethyl ether was 10/90. The obtained polymer corresponds to Formula (8-1) and had a weight average molecular weight measured by GPC of Mw 700 in terms of polystyrene.

Synthesis Example 2

11.59 g (50 mol %) of tetraisobutoxytitanium, 4.49 g (37 mol %) of methyltriethoxysilane, 0.85 g (3 mol %) of 3-(triethoxysilylpropyl)diallylisocyanurate, 1.35 g (10 mol %) of phenyltrimethoxysilane, 27.42 g of acetone, and 27.42 g of acetylacetone were charged into a 300-mL flask and while the reaction mixture solution was stirred with a magnetic stirrer, 4.30 g of a 0.01-mol/L hydrochloric acid was dropped into the reaction mixture solution. After the dropping, the flask was placed into an oil bath controlled to 85° C. and under warming-reflux, the reaction was effected for 240 minutes. Then, the reaction solution was cooled down to room temperature and to the reaction solution, 36.00 g of acetylacetone was added. From the resultant reaction mixture, ethanol, which was a reaction by-product, acetone, isobutanol, water, and hydrochloric acid were distilled off under reduced pressure and the resultant reaction mixture was concentrated to obtain a hydrolysis-condensation product (polymer) acetylacetone solution. To the obtained solution, acetylacetone and propylene glycol monoethyl ether were added to adjust the resultant solution to have a solid residue concentration at 140° C. of 15% by mass while a solvent ratio of acetylacetone/propylene glycol monoethyl ether was 10/90. The obtained polymer corresponds to Formula (8-2) and had a weight average molecular weight measured by GPC of Mw 900 in terms of polystyrene.

Synthesis Example 3

17.85 g (70 mol %) of tetraisopropoxytitanium, 3.20 g (20 mol %) of methyltriethoxysilane, 2.40 g (10 mol %) of biphenyl-4-yltrimethoxysilane, 35.26 g of acetone, and 35.26 g of acetylacetone were charged into a 300-mL flask and while the reaction mixture solution was stirred with a magnetic stirrer, 5.98 g of a 0.01-mol/L hydrochloric acid was dropped into the reaction mixture solution. After the dropping, the flask was placed into an oil bath controlled to 85° C. and under warming-reflux, the reaction was effected for 240 minutes. Then, the reaction solution was cooled down to room temperature and to the reaction solution, 48.00 g of acetylacetone was added. From the resultant reaction mixture, methanol and ethanol, which were reaction by-products, acetone, isopropanol, water, and hydrochloric acid were distilled off under reduced pressure and the resultant reaction mixture was concentrated to obtain a hydrolysis-condensation product (polymer) acetylacetone solution. To the obtained solution, acetylacetone and propylene glycol monoethyl ether were added to adjust the resultant solution to have a solid residue concentration at 140° C. of 15% by mass while a solvent ratio of acetylacetone/propylene glycol monoethyl ether was 10/90. The obtained polymer corresponds to Formula (8-3) and had a weight average molecular weight measured by GPC of Mw 800 in terms of polystyrene.

Synthesis Example 4

18.01 g (70 mol %) of tetraisopropoxytitanium, 3.23 g (20 mol %) of methyltriethoxysilane, 2.25 g (10 mol %) of 1-naphthyltrimethoxysilane, 35.24 g of acetone, and 35.24 g of acetylacetone were charged into a 300-mL flask and while the reaction mixture solution was stirred with a magnetic stirrer, 6.04 g of a 0.01-mol/L hydrochloric acid was dropped into the reaction mixture solution. After the dropping, the flask was placed into an oil bath controlled to 85° C. and under warming-reflux, the reaction was effected for 240 minutes. Then, the reaction solution was cooled down to room temperature and to the reaction solution, 46.00 g of acetylacetone was added. From the resultant reaction mixture, methanol and ethanol, which were reaction by-products, acetone, isopropanol, water, and hydrochloric acid were distilled off under reduced pressure and the resultant reaction mixture was concentrated to obtain a hydrolysis-condensation product (polymer) acetylacetone solution. To the obtained solution, acetylacetone and propylene glycol monoethyl ether were added to adjust the resultant solution to have a solid residue concentration at 140° C. of 15% by mass while a solvent ratio of acetylacetone/propylene glycol monoethyl ether was 10/90. The obtained polymer corresponds to Formula (8-4) and had a weight average molecular weight measured by GPC of Mw 800 in terms of polystyrene.

Synthesis Example 5

17.63 g (70 mol %) of tetraisopropoxytitanium, 3.16 g (20 mol %) of methyltriethoxysilane, 2.73 g (10 mol %) of 6-(methoxymethoxy)-2-(trimethoxysilyl)naphthalene, 35.28 g of acetone, and 35.28 g of acetylacetone were charged into a 300-mL flask and while the reaction mixture solution was stirred with a magnetic stirrer, 5.91 g of a 0.01-mol/L hydrochloric acid was dropped into the reaction mixture solution. After the dropping, the flask was placed into an oil bath controlled to 85° C. and under warming-reflux, the reaction was effected for 240 minutes. Then, the reaction solution was cooled down to room temperature and to the reaction solution, 48.00 g of acetylacetone was added. From the resultant reaction mixture, methanol and ethanol, which were reaction by-products, acetone, isopropanol, water, and hydrochloric acid were distilled off under reduced pressure and the resultant reaction mixture was concentrated to obtain a hydrolysis-condensation product (polymer) acetylacetone solution. To the obtained solution, acetylacetone and propylene glycol monoethyl ether were added to adjust the resultant solution to have a solid residue concentration at 140° C. of 15% by mass while a solvent ratio of acetylacetone/propylene glycol monoethyl ether was 10/90. The obtained polymer corresponds to Formula (8-5) and had a weight average molecular weight measured by GPC of Mw 800 in terms of polystyrene.

Synthesis Example 6

18.59 g (70 mol %) of tetraisobutoxytitanium, 3.44 g (24.7 mol %) of methyltriethoxysilane, 1.61 g (5 mol %) of 3-(triethoxysilylpropyl)diallylisocyanurate, 0.06 g (0.3 mol %) of N-(3-triethoxysilylpropyl)-4,5-dihydroimidazole, 35.55 g of acetone, and 35.55 g of acetylacetone were charged into a 300-mL flask and while the reaction mixture solution was stirred with a magnetic stirrer, 5.21 g of a 0.10-mol/L hydrochloric acid was dropped into the reaction mixture solution. After the dropping, the flask was placed into an oil bath controlled to 85° C. and under warming-reflux, the reaction was effected for 240 minutes. Then, the reaction solution was cooled down to room temperature and to the reaction solution, 48.00 g of acetylacetone was added. From the resultant reaction mixture, ethanol, which was a reaction by-product, acetone, isobutanol, water, and hydrochloric acid were distilled off under reduced pressure and the resultant reaction mixture was concentrated to obtain a hydrolysis-condensation product (polymer) acetylacetone solution. To the obtained solution, acetylacetone and propylene glycol monoethyl ether were added to adjust the resultant solution to have a solid residue concentration at 140° C. of 15% by mass while a solvent ratio of acetylacetone/propylene glycol monoethyl ether was 10/90. The obtained polymer corresponds to Formula (8-6) and had a weight average molecular weight measured by GPC of Mw 800 in terms of polystyrene.

Synthesis Example 7

18.74 g (70 mol %) of tetraisobutoxytitanium, 3.46 g (24.7 mol %) of methyltriethoxysilane, 1.42 g (5 mol %) of 3-(triethoxysilylpropyl)dimethylisocyanurate, 0.065 g (0.3 mol %) of N-(3-triethoxysilylpropyl)-4,5-dihydroimidazole, 35.53 g of acetone, and 35.53 g of acetylacetone were charged into a 300-mL flask and while the reaction mixture solution was stirred with a magnetic stirrer, 5.25 g of a 0.10-mol/L hydrochloric acid was dropped into the reaction mixture solution. After the dropping, the flask was placed into an oil bath controlled to 85° C. and under warming-reflux, the reaction was effected for 240 minutes. Then, the reaction solution was cooled down to room temperature and to the reaction solution, 48.00 g of acetylacetone was added. From the resultant reaction mixture, ethanol, which was a reaction by-product, acetone, isobutanol, water, and hydrochloric acid were distilled off under reduced pressure and the resultant reaction mixture was concentrated to obtain a hydrolysis-condensation product (polymer) acetylacetone solution. To the obtained solution, acetylacetone and propylene glycol monoethyl ether were added to adjust the resultant solution to have a solid residue concentration at 140° C. of 15% by mass while a solvent ratio of acetylacetone/propylene glycol monoethyl ether was 10/90. The obtained polymer corresponds to Formula (8-7) and had a weight average molecular weight measured by GPC of Mw 800 in terms of polystyrene.

Synthesis Example 8

15.60 g (60 mol %) of tetraisobutoxytitanium, 1.91 g (10 mol %) of tetraethoxysilane, 4.08 g (25 mol %) of methyltriethoxysilane, 1.89 g (5 mol %) of 3-(triethoxysilylpropyl)diallylisocyanurate, 35.21 g of acetone, and 35.21 g of acetylacetone were charged into a 300-mL flask and while the reaction mixture solution was stirred with a magnetic stirrer, 6.10 g of a 0.01-mol/L hydrochloric acid was dropped into the reaction mixture solution. After the dropping, the flask was placed into an oil bath controlled to 85° C. and under warming-reflux, the reaction was effected for 240 minutes. Then, the reaction solution was cooled down to room temperature and to the reaction solution, 48.00 g of acetylacetone was added. From the resultant reaction mixture, ethanol, which was a reaction by-product, acetone, isobutanol, water, and hydrochloric acid were distilled off under reduced pressure and the resultant reaction mixture was concentrated to obtain a hydrolysis-condensation product (polymer) acetylacetone solution. To the obtained solution, acetylacetone and propylene glycol monoethyl ether were added to adjust the resultant solution to have a solid residue concentration at 140° C. of 15% by mass while a solvent ratio of acetylacetone/propylene glycol monoethyl ether was 10/90. The obtained polymer corresponds to Formula (8-8) and had a weight average molecular weight measured by GPC of Mw 1,000 in terms of polystyrene.

Synthesis Example 9

17.73 g (50 mol %) of tetraisopropoxytitanium, 7.75 g (45 mol %) of methyltriethoxysilane, 2.00 g (5 mol %) of 3-(triethoxysilylpropyl)diallylisocyanurate, 35.22 g of acetone, and 35.22 g of acetylacetone were charged into a 300-mL flask and while the reaction mixture solution was stirred with a magnetic stirrer, 6.09 g of a 0.01-mol/L hydrochloric acid was dropped into the reaction mixture solution. After the dropping, the flask was placed into an oil bath controlled to 85° C. and under warming-reflux, the reaction was effected for 240 minutes. Then, the reaction solution was cooled down to room temperature and to the reaction solution, 48.00 g of acetylacetone was added. From the resultant reaction mixture, ethanol, which was a reaction by-product, acetone, isopropanol, water, and hydrochloric acid were distilled off under reduced pressure and the resultant reaction mixture was concentrated to obtain a hydrolysis-condensation product (polymer) acetylacetone solution. To the obtained solution, acetylacetone and 4-methyl-2-pentanol were added to adjust the resultant solution to have a solid residue concentration at 140° C. of 8% by mass while a solvent ratio of acetylacetone/4-methyl-2-pentanol was 5/95. The obtained polymer of Formula (8-1) had a weight average molecular weight measured by GPC of Mw 800 in terms of polystyrene.

Synthesis Example 10

18.60 g (70 mol %) of tetraisobutoxytitanium, 3.48 g (25 mol %) of methyltriethoxysilane, 1.62 g (5 mol %) of 3-(triethoxysilylpropyl)diallylisocyanurate, 35.55 g of acetone, and 35.55 g of acetylacetone were charged into a 300-mL flask and while the reaction mixture solution was stirred with a magnetic stirrer, 5.21 g of a 0.01-mol/L hydrochloric acid was dropped into the reaction mixture solution. After the dropping, the flask was placed into an oil bath controlled to 85° C. and under warming-reflux, the reaction was effected for 240 minutes. Then, the reaction solution was cooled down to room temperature and to the reaction solution, 48.00 g of acetylacetone was added. From the resultant reaction mixture, ethanol, which was a reaction by-product, acetone, isobutanol, water, and hydrochloric acid were distilled off under reduced pressure and the resultant reaction mixture was concentrated to obtain a hydrolysis-condensation product (polymer) acetylacetone solution. To the obtained solution, acetylacetone and 4-methyl-2-pentanol were added to adjust the resultant solution to have a solid residue concentration at 140° C. of 8% by mass while a solvent ratio of acetylacetone/4-methyl-2-pentanol was 5/95. The obtained polymer of Formula (8-1) had a weight average molecular weight measured by GPC of Mw 700 in terms of polystyrene.

Comparative Synthesis Example 1

16.70 g (70 mol %) of tetraethoxysilane, 5.14 g (25 mol %) of methyltriethoxysilane, 1.14 g (5 mol %) of phenyltrimethoxysilane, and 69.24 g of acetone were charged into a 300-mL flask and while the reaction mixture solution was stirred with a magnetic stirrer, 7.68 g of a 0.01-mol/L hydrochloric acid was dropped into the reaction mixture solution. After the dropping, the flask was placed into an oil bath controlled to 85° C. and under warming-reflux, the reaction was effected for 240 minutes. Then, the reaction solution was cooled down to room temperature and to the reaction solution, 46.00 g of propylene glycol monoethyl ether was added. From the resultant reaction mixture, methanol and ethanol, which were reaction by-products, acetone, water, and hydrochloric acid were distilled off under reduced pressure and the resultant reaction mixture was concentrated to obtain a hydrolysis-condensation product (polymer) propylene glycol monoethyl ether solution. To the obtained solution, acetylacetone and propylene glycol monoethyl ether were added to adjust the resultant solution to have a solid residue concentration at 140° C. of 15% by mass while a solvent ratio of acetylacetone/propylene glycol monoethyl ether was 10/90. The obtained polymer corresponds to Formula (9-1) and had a weight average molecular weight measured by GPC of Mw 1,200 in terms of polystyrene.

Formula (9-1)

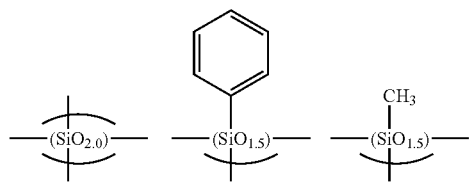

Comparative Synthesis Example 2

19.25 g (70 mol %) of tetraisobutoxytitanium, 3.60 g (25 mol %) of methyltriethoxysilane, 0.80 g (5 mol %) of phenyltrimethoxysilane, 35.48 g of acetone, and 35.48 g of acetylacetone were charged into a 300-mL flask and while the reaction mixture solution was stirred with a magnetic stirrer, 5.39 g of a 0.01-mol/L hydrochloric acid was dropped into the reaction mixture solution. After the dropping, the flask was placed into an oil bath controlled to 85° C. and under warming-reflux, the reaction was effected for 240 minutes. Then, the reaction solution was cooled down to room temperature and to the reaction solution, 48.00 g of acetylacetone was added. From the resultant reaction mixture, methanol and ethanol, which were reaction by-products, acetone, isobutanol, water, and hydrochloric acid were distilled off under reduced pressure and the resultant reaction mixture was concentrated to obtain a hydrolysis-condensation product (polymer) acetylacetone solution. To the obtained solution, acetylacetone and propylene glycol monoethyl ether were added to adjust the resultant solution to have a solid residue concentration at 140° C. of 15% by mass while a solvent ratio of acetylacetone/propylene glycol monoethyl ether was 10/90. The obtained polymer of Formula (9-2) had a weight average molecular weight measured by GPC of Mw 1,000 in terms of polystyrene.

Formula (9-2)

Hereinafter, the evaluation results in the case where the thin film forming composition of the present invention is used as a resist underlayer film, are shown below.

[Preparation of Thin Film (Resist Underlayer Film)]

By blending each of the titanium-silicon-containing polymers obtained in Synthesis Examples 1 to 10 and Comparative Synthesis Examples 1 and 2, an acid, a curing catalyst, an additive, a solvent, and water so that ratios of these components were the ratios shown in Table 1 and by filtering the resultant blend with a 0.1 pin fluorinated resin filter, each of the solutions of the thin film forming compositions (resist underlayer film forming compositions) was prepared. In Table 1, the blending ratio of the polymer indicates not the blending amount of the polymer solution, but the blending amount of the polymer itself.

In Table 1, maleic acid is abbreviated as MA; benzyltriethylammonium chloride is abbreviated as BTAC; N-(3-triethoxysilylpropyl)-4,5-dihydroimidazole is abbreviated as IMIDTEOS; triphenylsulfoniumtrifluoromethane sulfonate is abbreviated as TPS105; monotriphenylsulfonium maleate is abbreviated as TPSMA; propylene glycol monomethyl ether acetate is abbreviated as PGMEA; propylene glycol monoethyl ether is abbreviated as PGEE; propylene glycol monomethyl ether is abbreviated as PGME; acetylacetone is abbreviated as AcAc; and 4-methyl-2-pentanol (that is, methylisobutylcarbinol) is abbreviated as MIBC. As the water, ultrapure water was used. Each blending amount is expressed in parts by mass.

TABLE 1

|  | Polymer | Acid | Curing catalyst | Additive | Solvent | | | |
|---|---|---|---|---|---|---|---|---|
| Example 1 (parts by mass) | Synthesis Example 1 | MA 0.02 | BTAC 0.012 |  | PGME 10 | PGEE 72 | AcAc 5 | Water 13 |
| Example 2 (parts by mass) | Synthesis Example 2 | MA 0.02 | BTAC 0.012 |  | PGME 10 | PGEE 72 | AcAc 5 | Water 13 |
| Example 3 (parts by mass) | Synthesis Example 3 | MA 0.02 | BTAC 0.012 |  | PGME 10 | PGEE 72 | AcAc 5 | Water 13 |
| Example 4 (parts by mass) | Synthesis Example 4 | MA 0.02 | BTAC 0.012 |  | PGME 10 | PGEE 72 | AcAc 5 | Water 13 |

TABLE 1-continued

| | Polymer | Acid | Curing catalyst | Additive | Solvent | | | Water |
|---|---|---|---|---|---|---|---|---|
| Example 5 (parts by mass) | Synthesis Example 5 2 | MA 0.02 | BTAC 0.012 | | PGME 10 | PGEE 72 | AcAc 5 | Water 13 |
| Example 6 (parts by mass) | Synthesis Example 1 2 | MA 0.02 | IMIDTEOS 0.012 | | PGME 10 | PGEE 72 | AcAc 5 | Water 13 |
| Example 7 (parts by mass) | Synthesis Example 1 2 | MA 0.02 | TPSMA 0.012 | | PGME 10 | PGEE 72 | AcAc 5 | Water 13 |
| Example 8 (parts by mass) | Synthesis Example 1 2 | MA 0.02 | IMIDTEOS 0.012 | TPS105 0.02 | PGME 10 | PGEE 72 | AcAc 5 | Water 13 |
| Example 9 (parts by mass) | Synthesis Example 8 2 | MA 0.02 | | | PGME 10 | PGEE 72 | AcAc 5 | Water 13 |
| Example 10 (parts by mass) | Synthesis Example 8 2 | MA 0.02 | | TPS105 0.02 | PGME 10 | PGEE 78 | AcAc 5 | Water 7 |
| Example 11 (parts by mass) | Synthesis Example 6 2 | MA 0.02 | TPSMA 0.012 | TPS105 0.02 | PGME 10 | PGEE 80 | AcAc 5 | Water 5 |
| Example 12 (parts by mass) | Synthesis Example 7 2 | MA 0.02 | | | PGME 10 | PGEE 72 | AcAc 5 | Water 13 |
| Example 13 (parts by mass) | Synthesis Example 7 2 | MA 0.02 | | TPS105 0.02 | PGME 10 | PGEE 78 | AcAc 5 | Water 7 |
| Example 14 (parts by mass) | Synthesis Example 8 2 | MA 0.02 | BTAC 0.012 | | PGME 10 | PGEE 72 | AcAc 5 | Water 13 |
| Example 15 (parts by mass) | Synthesis Example 8 2 | MA 0.02 | IMIDTEOS 0.012 | | PGME 10 | PGEE 72 | AcAc 5 | Water 13 |
| Example 16 (parts by mass) | Synthesis Example 9 4 | | | | MIBC 97 | | AcAc 3 | |
| Example 17 (parts by mass) | Synthesis Example 10 4 | | | | MIBC 97 | | AcAc 3 | |
| Example 18 (parts by mass) | Synthesis Example 1 2 | MA 0.02 | BTAC 0.012 | | PGME 10 | PGEE 85 | AcAc 5 | |
| Example 19 (parts by mass) | Synthesis Example 1 2 | MA 0.02 | | | PGME 10 | PGEE 85 | AcAc 5 | |
| Comparative Example 1 (parts by mass) | Comparative Synthesis Example 1 2 | MA 0.02 | BTAC 0.012 | | PGME 10 | PGEE 72 | AcAc 5 | Water 13 |
| Comparative Example 2 (parts by mass) | Comparative Synthesis Example 2 2 | MA 0.02 | BTAC 0.012 | | PGME 10 | PGEE 72 | AcAc 5 | Water 13 |

(Preparation of Organic Underlayer Film (Layer A))

In nitrogen, into a 100 mL four-neck flask, carbazole (6.69 g, 0.040 mol, manufactured by Tokyo Chemical Industry Co., Ltd.), 9-fluorenone (7.28 g, 0.040 mol, manufactured by Tokyo Chemical Industry Co., Ltd.), and p-toluenesulfonic acid monohydrate (0.76 g, 0.0040 mol, manufactured by Tokyo Chemical Industry Co., Ltd.) were charged and thereto, 1,4-dioxane (6.69 g, manufactured by Kanto Chemical Industry Co., Ltd.) was charged to stir the resultant reaction mixture. The temperature of the reaction mixture was elevated to 100° C. for dissolution and the polymerization was initiated. After 24 hours, the reaction mixture was left to be cooled down to 60° C. and to the reaction mixture, chloroform (34 g, manufactured by Kanto Chemical Industry Co., Ltd.) was added to dilute the reaction mixture, which was followed by reprecipitating the resultant reaction mixture in methanol (168 g, manufactured by Kanto Chemical Industry Co., Ltd.). The obtained precipitation was filtered and was dried by a reduced pressure dryer at 80° C. for 24 hours to obtain 9.37 g of an objective polymer (Formula (10-1), hereinafter, abbreviated as PCzFL).

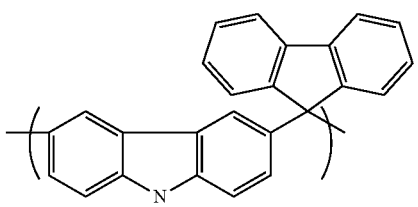

Formula (10-1)

The measurement result of $^1$H-NMR of PCzFL was as follows.

$^1$H-NMR (400 MHz, DMSO-d$_6$): δ7.03-7.55 (br, 12H), δ7.61-8.10 (br, 4H), δ11.18 (br, 1H)

PCzFL had a weight average molecular weight Mw of 2,800 and a polydispersity Mw/Mn of 1.77 that were measured by GPC in terms of polystyrene.

With 20 g of the obtained polymer [Formula (10-1)], 3.0 g of tetramethoxymethyl glycoluril (trade name: POWDER LINK 1174; manufactured by Mitsui Cytec Ltd.) as a crosslinker, 0.30 g of pyridinium p-toluenesulfonate as a catalyst, and 0.06 g of MEGAFAC R-30 (trade name; manufactured by Dainihon Ink & Chemicals Inc.) as a surfactant were mixed and the resultant mixture was dissolved in 88 g of propylene glycol monomethyl ether acetate to prepare a solution. Then, the solution was filtered using a polyethylene microfilter having a pore diameter of 0.10 μm, and the filtrate was further filtered using a polyethylene microfilter having a pore diameter of 0.05 μm to prepare a solution of an organic underlayer film forming composition to be used for a lithography process by a multilayer film.

(Preparation of Organic Resist Underlayer Film (Layer C))

100 g of monoallyldiglycidylisocyanuric acid (manufactured by Shikoku Chemicals Corporation) and 66.4 g of 5,5-diethylbarbituric acid were dissolved in 682 g of propylene glycol monomethyl ether. The resultant reaction solution was warmed to 140° C., and simultaneously nitrogen was flowed into the reaction solution. Then, to the reaction solution, 4.1 g of benzyltriethylammonium chloride as a catalyst was added and the resultant reaction mixture was stirred in a nitrogen atmosphere for 24 hours. When the obtained reaction product was subjected to GPC analysis, the reaction product had a weight average molecular weight of 6,800 in terms of standard polystyrene.

The reaction product obtained by the present synthesis is estimated to contain a compound having a structure unit of Formula (11-1):

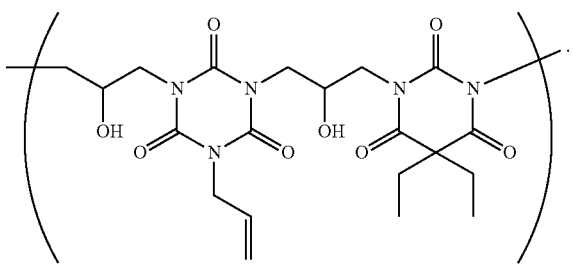

Formula (11-1)

To 10 g of a solution containing 2 g of the above-obtained polymer [Formula (11-1)], 0.5 g of tetramethoxymethyl glycoluril (trade name: POWDER LINK 1174; manufactured by Mitsui Cytec Ltd.), 0.05 g of pyridinium-p-toluenesulfonate, 23 g of propylene glycol monomethyl ether, and 31 g of ethyl lactate were added to prepare a solution. Then, the solution was filtered using a polyethylene microfilter having a pore diameter of 0.10 μm, and the filtrate was further filtered using a polyethylene microfilter having a pore diameter of 0.02 μm to prepare a solution of an organic resist underlayer film forming composition.

(Measurement of Optical Constants)

Each of the thin film forming compositions (resist underlayer film forming compositions) prepared in Examples 1 to 15, Examples 18 to 19, and Comparative Examples 1 and 2 was applied onto a silicon wafer using a spinner. The composition was heated on a hot plate at 240° C. for 1 minute to form a thin film (resist underlayer film) (film thickness: 0.05 μm). Then, the refractive index (n value) and the optical absorptivity (k value; also called the attenuation coefficient) of the thin film (resist underlayer film) at each of wavelengths of 193, 200, and 248 nm were measured using a spectro-ellipsometer (VUV-VASE VU-302; manufactured by J. A. Woollam Co., Inc.).

(Measurement of Dry Etching Rate)

Etchers and etching gases used in the measurement of dry etching rates were as follows.

RIE-10NR (Manufactured by Samco, Inc.): O$_2$

Each of the solutions of the thin film forming compositions (resist underlayer film forming compositions) prepared in Examples 1 to 15, Examples 18 to 19, and Comparative Examples 1 and 2 was applied onto a silicon wafer using a spinner. Each of the composition solutions was heated on a hot plate at 240° C. for 1 minute to form a thin film (resist underlayer films) of 0.05 μm.

In the same manner, the organic underlayer film forming composition was applied onto a silicon wafer using a spinner to form a coating film (film thickness: 0.20 μm) thereof. The dry etching rate of the organic underlayer film was measured using O$_2$ gas as the etching gas, and was compared with the dry etching rate of each of the thin films (resist underlayer films) of Examples 1 to 15 and Comparative Examples 1 and 2.

(Pattern Wafer Etching Evaluation)

The organic underlayer film (layer A) forming composition prepared as described above was applied onto a silicon wafer and the composition was baked on a hot plate at 240° C. for 60 seconds to obtain an organic underlayer film (layer A) having a film thickness of 200 nm. Onto the organic underlayer film, each of the thin film forming compositions [resist underlayer film (B) forming compositions] obtained in Examples 1 to 15, Examples 18 to 19, and Comparative Examples 1 and 2 was applied. The composition was baked on a hot plate at 240° C. for 45 seconds to obtain a thin film [resist underlayer film (layer B)]. The thin film [resist underlayer film (layer B)] had a film thickness of 25 nm.

Onto each thin film, a commercially available photoresist solution (trade name: PAR 855; manufactured by Sumitomo Chemical Co., Ltd.) was applied by a spinner and the solution was baked on a hot plate at 100° C. for 60 seconds to form a photoresist film (layer D) having a film thickness of 120 nm. The patterning of the resist was performed using an ArF exposing machine (trade name: S-307E; manufactured by Nikon Corporation (wavelength: 193 nm, NA, σ: 0.85, 0.93/0.85 (Dipole), immersion liquid: water)). The target was a photoresist that has, after the development, line widths and line spacings of 0.065 μm, which are so-called lines and spaces (dense lines), and the exposure was performed through a mask set to form such a photoresist.

Then, the resist pattern was baked on a hot plate at 105° C. for 60 seconds, was cooled down, and was developed with a tetramethylammonium hydroxide aqueous solution (developer) having a concentration of 2.38% by mass in a 60-second single paddle process. The patterned wafer was etched with the etching gas below and the thin film shape (resist underlayer film shape) of the present invention after the etching was observed. In the etching of the thin film (resist underlayer film) of the present invention, it was confirmed that the thin film (resist underlayer film) of the present invention was etched using a CF$_4$ gas under the conditions below and then, the organic resist underlayer film was etched with an O$_2$/N$_2$ gas.

RIE-10NR (Manufactured by Samco, Inc.)
CF$_4$: 50 sccm/Ar: 200 sccm, 15 Pa, 200 W
O$_2$: 10 sccm/N$_2$: 20 sccm, 1 Pa, 300 W, 110 seconds Table 2 shows a refractive index n1 and an optical absorptivity k1 at a wavelength of 193 nm; a refractive index n2 and an optical absorptivity k2 at a wavelength of 220 nm; a refractive index n3 and an optical absorptivity k3 at a wavelength of 248 nm; and the pattern shape after the etching

TABLE 2

|  | n1 | k1 | n2 | k2 | n3 | k3 | Shape |
|---|---|---|---|---|---|---|---|
| Example 1 | 1.74 | 0.50 | 1.76 | 0.44 | 1.87 | 0.41 | Rectangle |
| Example 2 | 1.74 | 0.50 | 1.77 | 0.34 | 1.81 | 0.27 | Rectangle |
| Example 3 | 1.58 | 0.54 | 1.80 | 0.49 | 1.82 | 0.50 | Rectangle |
| Example 4 | 1.57 | 0.45 | 1.69 | 0.67 | 1.93 | 0.41 | Rectangle |
| Example 5 | 1.54 | 0.43 | 1.55 | 0.59 | 1.92 | 0.57 | Rectangle |
| Example 6 | 1.74 | 0.50 | 1.76 | 0.44 | 1.87 | 0.41 | Rectangle |
| Example 7 | 1.74 | 0.50 | 1.76 | 0.44 | 1.87 | 0.41 | Rectangle |
| Example 8 | 1.74 | 0.52 | 1.76 | 0.44 | 1.87 | 0.41 | Rectangle |
| Example 9 | 1.74 | 0.50 | 1.76 | 0.44 | 1.87 | 0.41 | Rectangle |
| Example 10 | 1.74 | 0.51 | 1.75 | 0.45 | 1.87 | 0.41 | Rectangle |
| Example 11 | 1.74 | 0.51 | 1.75 | 0.45 | 1.87 | 0.41 | Rectangle |
| Example 12 | 1.73 | 0.49 | 1.76 | 0.44 | 1.87 | 0.41 | Rectangle |
| Example 13 | 1.73 | 0.50 | 1.75 | 0.45 | 1.87 | 0.41 | Rectangle |
| Example 14 | 1.70 | 0.43 | 1.72 | 0.37 | 1.81 | 0.32 | Rectangle |
| Example 15 | 1.70 | 0.45 | 1.72 | 0.37 | 1.81 | 0.32 | Rectangle |
| Example 18 | 1.74 | 0.50 | 1.76 | 0.44 | 1.87 | 0.41 | Rectangle |
| Example 19 | 1.74 | 0.50 | 1.76 | 0.44 | 1.87 | 0.41 | Rectangle |
| Comparative Example 1 | 1.62 | 0.12 | 1.57 | 0.01 | 1.49 | 0.00 | Rounding |
| Comparative Example 2 | 1.68 | 0.56 | 1.74 | 0.49 | 1.86 | 0.46 | Rectangle |

Figure 2:
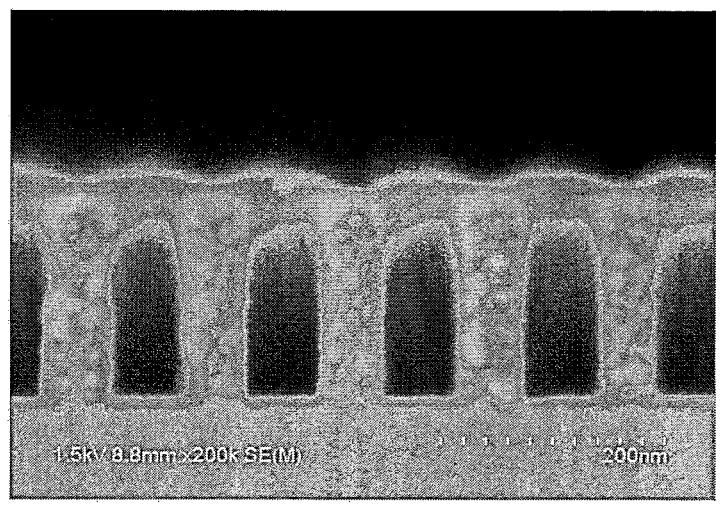
FIG. 2 is an electron microscope photograph of a cross section of a resist pattern obtained in Comparative Example 1.

An electron microscope photograph of the shape after the etching in Example 1 is shown in FIG. 1. An electron microscope photograph of the shape after the etching in Comparative Example 1 is shown in FIG. 2.

In the above pattern shapes after the etching, "rounding" is such a phenomenon that when a pattern is transferred to the organic underlayer film, a pattern rounding is caused by an oxygen-based gas etching, so that the pattern is rounded. The more rectangular the pattern is, the more advantageously the pattern can be transferred.

(Measurement of Etching Rate)

Each of the solutions of the thin film forming compositions (resist underlayer film forming compositions) prepared in Examples 1 to 19 and Comparative Examples 1 and 2 was applied onto a silicon wafer using a spinner. Each of the composition solutions was heated on a hot plate at 240° C. for 1 minute to form a thin film (resist underlayer films) of 0.05 μm. The organic underlayer film forming composition was applied onto a silicon wafer using a spinner to form an organic underlayer film (film thickness: 0.20 μm) on a silicon wafer. In the same manner, the resist was applied onto a silicon wafer using a spinner. The resist was heated on a hot plate at 100° C. for 1 minute to form a resist film of 0.10 μm.

Using a 2300 Versys etching apparatus and a Kiyo 45 chamber (trade name; manufactured by Lam Research Corporation) and using as a halogen-based etching gas, an HBr/Cl$_2$/CF$_4$/O$_2$-based gas, the dry etching rate of the resist film was compared with that of the thin film (resist underlayer film) of each of Examples 1 to 19 and Comparative Examples 1 and 2. Using RIE-10NR (manufactured by Samco, Inc.) and using as an etching gas, an O$_2$ gas, the dry etching rate of the organic underlayer film was measured and it was compared with the dry etching rate of the thin film (resist underlayer film) of each of Examples 1 to 19 and Comparative Examples 1 and 2.

The etching rate ratio (1) by the halogen-based gas was calculated as (thin film (resist underlayer film (layer B)))/(resist film (layer D)).

The resistance against an oxygen-based gas (O$_2$ gas) was shown as the etching rate ratio (2) of (thin film (resist underlayer film (layer B)))/(organic underlayer film (layer A)).

TABLE 3

|  | Rate ratio (1) | Rate ratio (2) |
|---|---|---|
| Example 1 | 1.11 | 0.02 |
| Example 2 | 1.30 | 0.02 |
| Example 3 | 1.30 | 0.02 |
| Example 4 | 1.43 | 0.02 |
| Example 5 | 1.28 | 0.02 |
| Example 6 | 1.11 | 0.02 |
| Example 7 | 1.12 | 0.02 |
| Example 8 | 1.12 | 0.02 |
| Example 9 | 1.11 | 0.02 |
| Example 10 | 1.12 | 0.02 |
| Example 11 | 1.12 | 0.02 |
| Example 12 | 1.11 | 0.02 |
| Example 13 | 1.11 | 0.02 |
| Example 14 | 1.29 | 0.02 |
| Example 15 | 1.30 | 0.02 |
| Example 16 | 1.35 | 0.03 |
| Example 17 | 1.15 | 0.03 |
| Example 18 | 1.11 | 0.02 |
| Example 19 | 1.11 | 0.02 |
| Comparative Example 1 | 1.03 | 0.02 |
| Comparative Example 2 | 1.02 | 0.02 |

The thin film (resist underlayer film) used in the present invention has a higher etching rate (rate ratio 1) than that of the resist underlayer film of each of Comparative Examples when the resist pattern is transferred to the thin film (resist underlayer film) of the present invention, and the resist pattern can be accurately transferred.

[Formation of Resist Pattern by Four-Layer Stack]

For the four-layer process evaluation, the organic underlayer film (layer A) forming composition obtained from the polymer of Formula (10-1) was applied onto a silicon wafer and the composition was baked on a hot plate at 400° C. for 60 seconds to obtain an organic underlayer film (layer A) having a film thickness of 200 nm. Onto the organic underlayer film (layer A), each of the thin film forming compositions [resist underlayer film (layer B) forming compositions] obtained in Examples 1 to 15, Examples 18 to 19, and Comparative Example 2 was applied and the composition was baked on a hot plate at 240° C. for 45 seconds to obtain the thin film [resist underlayer film (layer B)] of the present invention. The thin film [resist underlayer film (layer B)] of the present invention had a film thickness of 25 nm. Onto the thin film [resist underlayer film (layer B)], the organic resist underlayer film (layer C) forming composition obtained from the polymer of Formula (11-1) was applied, and the composition was baked on a hot plate at 205° C. for 60 seconds to obtain the organic resist underlayer film (layer C) having a film thickness of 25 nm. Onto the organic resist underlayer film (layer C), a commercially available photoresist solution (trade name: PAR 855; manufactured by Sumitomo Chemical Co., Ltd.) was applied by a spinner and the solution was baked on a hot plate at 100° C. for 60 seconds to form a photoresist film (layer D) having a film thickness of 120 nm.

The patterning of the resist was performed using an ArF exposing machine (trade name: S-307E; manufactured by Nikon Corporation (wavelength: 193 nm, NA, σ: 0.85, 0.93/0.85 (Dipole), immersion liquid: water)). The target was a photoresist that has line widths and line spacings of 0.065 μm, which are so-called lines and spaces (dense lines), and the exposure was performed through a mask set to form such a photoresist. Then, the resist pattern was baked on a hot plate at 105° C. for 60 seconds, was cooled down, and was developed with a tetramethylammonium hydroxide aqueous solution (developer) having a concentration of 2.38% by mass in a 60-second single paddle process.

TABLE 4

|  | Pattern formation | Pattern shape |
| --- | --- | --- |
| Example 1 | Possible | Advantageous |
| Example 2 | Possible | Advantageous |
| Example 3 | Possible | Advantageous |
| Example 4 | Possible | Advantageous |
| Example 5 | Possible | Advantageous |
| Example 6 | Possible | Advantageous |
| Example 7 | Possible | Advantageous |
| Example 8 | Possible | Advantageous |
| Example 9 | Possible | Advantageous |
| Example 10 | Possible | Advantageous |
| Example 11 | Possible | Advantageous |
| Example 12 | Possible | Advantageous |
| Example 13 | Possible | Advantageous |
| Example 14 | Possible | Advantageous |
| Example 15 | Possible | Advantageous |
| Example 18 | Possible | Advantageous |
| Example 19 | Possible | Advantageous |
| Comparative Example 2 | Possible | Advantageous |

[Formation of Resist Pattern by EUV Exposure]

The organic underlayer film (layer A) forming composition obtained from the polymer of Formula (10-1) was applied onto a silicon wafer and the composition was baked on a hot plate at 240° C. for 60 seconds to obtain an organic underlayer film (layer A) having a film thickness of 90 nm. The organic underlayer film (layer A) was spin-coated with each of the thin film forming composition (resist underlayer film forming composition) solutions of the present invention prepared in Examples 1 to 15, Examples 18 to 19, and Comparative Example 2 and the solution was heated at 240° C. for 1 minute to form a thin film [resist underlayer film (layer B)] (25 nm). The resultant hardmask was spin-coated with a resist solution (methacrylate resin-based resist) for EUV and the resist solution was heated to form an EUV resist layer (layer D). The EUV resist layer (layer D) was exposed to light using an EUV exposing apparatus (Micro Exposure Tool, abbreviated as MET) under conditions of NA=0.30, σ=0.36/0.68 Quadropole. After the exposure, the EUV resist layer (layer D) was subjected to PEB, was cooled down to room temperature on a cooling plate, and was subjected to development and a rinse treatment to form a resist pattern. The resist pattern was evaluated by evaluating whether or not the pattern formation of a line and space of 26 nm was possible or not possible and by the pattern shape observed by the pattern cross section observation.

TABLE 5

|  | Pattern formation | Pattern shape |
| --- | --- | --- |
| Example 1 | Possible | Advantageous |
| Example 2 | Possible | Advantageous |
| Example 3 | Possible | Advantageous |
| Example 4 | Possible | Advantageous |
| Example 5 | Possible | Advantageous |
| Example 6 | Possible | Advantageous |
| Example 7 | Possible | Advantageous |
| Example 8 | Possible | Advantageous |
| Example 9 | Possible | Advantageous |
| Example 10 | Possible | Advantageous |
| Example 11 | Possible | Advantageous |
| Example 12 | Possible | Advantageous |
| Example 13 | Possible | Advantageous |
| Example 14 | Possible | Advantageous |
| Example 15 | Possible | Advantageous |
| Example 18 | Possible | Advantageous |
| Example 19 | Possible | Advantageous |
| Comparative Example 2 | Possible | Advantageous |

In the EUV exposure, when light of around 160 to 240 nm is generated as light outside of 13.5 nm band, there occurs the problem that the resist is exposed to light and a pattern blur is caused. In order to solve such a problem, a film for absorbing OUT-of-BAND wavelength as an upper layer of the resist has been studied. Then, in the present invention, it is considered that the resist underlayer film existing as an underlayer of the resist exhibits the absorption of light in a wide wavelength range, so that the reflection of OUT-of-BAND wavelength on the resist interface can be easily controlled.

(Measurement of Optical Constants)

Each of the thin film forming compositions of the present invention prepared in Examples 16 and 17 was applied onto a silicon wafer using a spinner. The composition was heated on a hot plate at 240° C. for 1 minute to form the thin film (resist underlayer film) of the present invention (film thickness: 0.05 μm). Then, the refractive index (n value) and the optical absorptivity (k value; also called the attenuation coefficient) of the thin film at each of wavelengths of 193, 200, and 248 nm were measured using a spectro-ellipsometer (VUV-VASE VU-302; manufactured by J. A. Woollam Co., Inc.).

TABLE 6

|  | n1 | k1 | n2 | k2 | n3 | k3 |
| --- | --- | --- | --- | --- | --- | --- |
| Example 16 | 1.68 | 0.32 | 1.65 | 0.24 | 1.70 | 0.20 |
| Example 17 | 1.73 | 0.50 | 1.76 | 0.44 | 1.87 | 0.41 |

(Resist Mixing Test)

When the thin film formed from the thin film forming composition of the present invention is used as the EUV resist upper layer film (EUV out-of-band radiation absorbing film) or a reverse material, the thin film forming composition is applied as an upper layer of the resist. Therefore, it is necessary that the thin film forming composition does not cause the mixing with the resist.

A commercially available photoresist solution (trade name: PAR 855; manufactured by Sumitomo Chemical Co., Ltd.) was applied onto a silicon wafer by a spinner and the solution was baked on a hot plate at 100° C. for 60 seconds to form a photoresist film having a film thickness of 0.10 μm. Each of the thin film forming composition solutions prepared in Examples 16 to 17 and Comparative Example 1 was applied onto the resist using a spinner. The solution was heated on a hot plate at 100° C. for 1 minute to form a thin film of 0.10 μm formed from the thin film forming composition. If the resist was dissolved in the applied composition to cause the mixing, such a thin film forming composition was evaluated as disadvantageous, and if the resist was not dissolved in the applied composition and the thin film forming composition was applicable onto the resist, such a thin film forming composition was evaluated as advantageous.

Accordingly, the thin film formed from the thin film forming composition of the present invention can be used as an EUV resist upper layer film (EUV our-of-band radiation absorbing film) or a reverse material.

TABLE 7

| Resist mixing | |
| --- | --- |
| Example 16 | Advantageous |
| Example 17 | Advantageous |
| Comparative Example 1 | Disadvantageous |

(Developer Removing Property Test)

When the thin film formed from the thin film forming composition of the present invention is used as the EUV resist upper layer film (EUV out-of-band radiation absorbing film), after the exposure, the thin film is necessary to be removed by the developer. Therefore, the thin film is necessary to be dissolved in the developer. Each of the thin film forming composition (EUV resist upper layer film forming composition) solutions prepared in Examples 16 to 17 and Comparative Example 1 was applied onto a silicon wafer by a spinner and the solution was baked on a hot plate at 100° C. for 60 seconds to form an EUV resist upper layer film having a film thickness of 100 nm. Then, onto the EUV resist upper layer film, a tetramethylammonium hydroxide aqueous solution having a concentration of 2.38% by mass was applied and the EUV resist upper layer film was maintained for 1 minute. Then, the developer was shaken off by a high-speed rotation. If the EUV resist upper layer film was removed, the developer removing property of such a thin film forming composition (EUV resist upper layer film forming composition) was evaluated as advantageous. If the EUV resist upper layer film was not removed or an undissolved matter remained, the developer removing property of such a thin film forming composition (EUV resist upper layer film forming composition) was evaluated as disadvantageous.

TABLE 8

| Developer removing property | |
| --- | --- |
| Example 16 | Advantageous |
| Example 17 | Advantageous |
| Comparative Example 1 | Disadvantageous |

Accordingly, the thin film formed from the thin film forming composition of the present invention can be used as the EUV resist upper layer film (EUV out-of-band radiation absorbing film).

(Evaluation of Patterning of Resist for Solvent Development Process)

The above organic underlayer film forming composition [composition containing a polymer containing a unit structure of Formula (10-1)] was applied onto a silicon wafer and the composition was heated on a hot plate at 215° C. for 1 minute to form an organic underlayer film (layer A) having a film thickness of 200 nm.

Onto the organic underlayer film (layer A), each of the thin film forming compositions (resist underlayer film forming compositions) prepared in Examples 1 to 15, Examples 18 to 19, and Comparative Examples 1 and 2 was applied and the composition was heated on a hot plate at 240° C. for 1 minute to form a thin film [resist underlayer film (layer B)] having a film thickness of 20 nm. Onto the thin film [resist underlayer film (layer B)], a commercially available photoresist solution (trade name: FAiRS-9521NT05; manufactured by FUJIFILM Corporation) was applied by a spinner and the solution was heated on a hot plate at 100° C. for 1 minute to form a photoresist film (layer C) having a film thickness of 85 nm.

Subsequently, using an NSR-S307E scanner (manufactured by Nikon Corporation (wavelength: 193 nm, NA, σ: 0.85, 0.93\0.85), the exposure was performed through a mask set to form a photoresist that has, after the development, line widths and line spacings of 0.065 μm, that is, dense lines of 0.065 μm lines and spaces (L/S)=1. Then, the photoresist was baked on a hot plate at 100° C. for 60 seconds, was cooled down, and was developed using butyl acetate (solvent developer) for 60 seconds to form a negative-type pattern on the thin film [resist underlayer film (layer B)].

Among the obtained photoresist patterns, a photoresist pattern that did not have a large pattern peeling or an undercut was evaluated as advantageous.

TABLE 9

| | Pattern formation | Pattern shape |
| --- | --- | --- |
| Example 1 | Possible | Advantageous |
| Example 2 | Possible | Advantageous |
| Example 3 | Possible | Advantageous |
| Example 4 | Possible | Advantageous |
| Example 5 | Possible | Advantageous |
| Example 6 | Possible | Advantageous |
| Example 7 | Possible | Advantageous |
| Example 8 | Possible | Advantageous |
| Example 9 | Possible | Advantageous |
| Example 10 | Possible | Advantageous |
| Example 11 | Possible | Advantageous |
| Example 12 | Possible | Advantageous |
| Example 13 | Possible | Advantageous |
| Example 14 | Possible | Advantageous |
| Example 15 | Possible | Advantageous |
| Example 18 | Possible | Advantageous |
| Example 19 | Possible | Advantageous |
| Comparative Example 1 | Peeled | Disadvantageous |
| Comparative Example 2 | Possible | Advantageous |

Accordingly, the thin film formed from the thin film forming composition of the present invention can be used as an underlayer film of a resist for solvent development.

INDUSTRIAL APPLICABILITY

The thin film forming composition of the present invention can be utilized as a resist underlayer film forming composition for a photoresist or the like, a resist underlayer film forming composition for an EUV resist or the like, an EUV resist upper layer film forming composition, a reverse material forming composition, an underlayer film forming composition for a resist for solvent development, and the like.

The invention claimed is:

1. A thin film forming composition that is used together with a resist in a lithography process, comprising:
a mixture of a titanium compound (A) selected from a group consisting of a compound of Formula (1):

  Formula (1)

$R^0{}_a Ti(R^1)_{(4-a)}$          Formula (1)

wherein in Formula (1),
R$^0$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group and is bonded to a titanium atom through a Ti—C bond;
R$^1$ is an alkoxy group, an acyloxy group, or a halogen atom; and
a is an integer of 0 to 2,
a titanium chelate compound, and a hydrolyzable titanium dimer, and a silicon compound (B) of Formula (2):

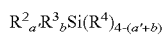
$$R^2{}_{a'}R^3{}_b Si(R^4)_{4-(a'+b)} \quad \text{Formula (2)}$$

wherein in Formula (2), $R^2$ is a nitrogen atom-containing ring group or an organic group containing a nitrogen atom-containing ring group, a condensed aromatic ring group or an organic group containing a condensed aromatic ring group, a protected phenolic hydroxy group or an organic group containing a protected phenolic hydroxy group, or a bisaryl group or an organic group containing a bisaryl group and is bonded to a silicon atom through a Si—C bond;

$R^3$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group and is bonded to a silicon atom through a Si—C bond or a Si—N bond;

$R^4$ is an alkoxy group, an acyloxy group, or a halogen atom; and a' is an integer of 1, and b is an integer of 0 or 1, wherein (a'+b) is an integer of 1 or 2, a hydrolysis product of the mixture, or a hydrolysis-condensation product of the mixture, wherein the number of moles of a Ti atom is 50% to 90% relative to the number of total moles in terms of a Ti atom and a Si atom in the composition.

2. The thin film forming composition according to claim 1, comprising:

a mixture of the titanium compound (A) selected from the group consisting of the compound of Formula (1), a titanium chelate compound, and a hydrolyzable titanium dimer, the silicon compound (B) of Formula (2), and a silicon compound (C) of Formula (3):

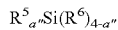
$$R^5{}_{a''}Si(R^6)_{4-a''} \quad \text{Formula (3)}$$

wherein in Formula (3), $R^5$ is an alkyl group, an aryl group, a halogenated alkyl group, a halogenated aryl group, an alkenyl group, or an organic group having an epoxy group, an acryloyl group, a methacryloyl group, a mercapto group, an amino group, a sulfonyl group, a sulfide bond, an ether bond, an ester bond, a sulfonamido group, or a cyano group and is bonded to a silicon atom through a Si—C bond;

$R^6$ is an alkoxy group, an acyloxy group, or a halogen atom; and a" is an integer of 0 to 3, a hydrolysis product of the mixture, or a hydrolysis-condensation product of the mixture.

3. The thin film forming composition according to claim 1, wherein the nitrogen atom-containing ring group or the organic group containing a nitrogen atom-containing ring group is an organic group of Formula (4):

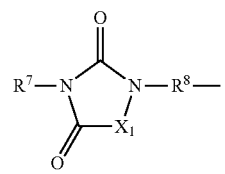

wherein in Formula (4), $R^7$ is a hydrogen atom, a C1-10 alkyl group, an alkenyl group, an epoxy group, a sulfonyl group, or an organic group containing any of a C1-10 alkyl group, an alkenyl group, an epoxy group, and a sulfonyl group;

$R^8$ is a C1-10 alkylene group, a hydroxyalkylene group, a sulfide bond, an ether bond, an ester bond, or a combination of any of a C1-10 alkylene group, a hydroxyalkylene group, a sulfide bond, an ether bond, and an ester bond; and $X_1$ is a group of Formula (5), Formula (6), or Formula (7):

wherein in Formula (5), Formula (6), and Formula (7), $R^9$ to $R^{13}$ are independently a hydrogen atom, a C1-10 alkyl group, an alkenyl group, an epoxy group, a sulfonyl group, or an organic group containing any of a hydrogen atom, a C1-10 alkyl group, an alkenyl group, an epoxy group, and a sulfonyl group, and is an organic group bonded to a silicon atom through a Si—C bond.

4. The thin film forming composition according to claim 1, wherein the nitrogen atom-containing ring group or the organic group containing a nitrogen atom-containing ring group is an imidazole group or an organic group containing an imidazole group.

5. The thin film forming composition according to claim 1, wherein the condensed aromatic ring group or the organic group containing a condensed aromatic ring group is a naphthyl group or an anthryl group.

6. The thin film forming composition according to claim 1, wherein the protected phenolic hydroxy group or the organic group containing a protected phenolic hydroxy group is an alkoxyalkyl-substituted aryl group or an alkoxyalkoxyalkyl-substituted aryl group.

7. The thin film forming composition according to claim 1, wherein the bisaryl group or the organic group containing a bisaryl group is a bisphenyl group.

8. The thin film forming composition according to claim 1, further comprising β-diketone and/or β-ketoester.

9. The thin film forming composition according to claim 1, further comprising an acid.

10. The thin film forming composition according to claim 1, further comprising a salt.

11. The thin film forming composition according to claim 1, further comprising water.

12. A thin film obtained by applying the thin film forming composition as claimed in claim 1 onto a semiconductor substrate and by baking the composition.

13. A method for producing a semiconductor device, comprising:
applying the thin film forming composition as claimed in claim 1 onto a semiconductor substrate and baking the composition to form a thin film;
applying a composition for a resist onto the thin film to form a resist film;
exposing the resist film to light;
developing the resist film after the exposure to obtain a resist pattern;
etching the thin film according to the resist pattern; and
processing the semiconductor substrate according to the patterned resist film and the patterned thin film.

14. The method according to claim 13, wherein the resist is an EUV resist.

15. A method for producing a semiconductor device, comprising:
forming an organic underlayer film on a semiconductor substrate;
applying the thin film forming composition as claimed in claim 1 onto the organic underlayer film and baking the composition to form a thin film;
applying a composition for a resist onto the thin film to form a resist film;
exposing the resist film to light;
developing the resist film after the exposure to obtain a resist pattern;
etching the thin film according to the resist pattern;
etching the organic underlayer film according to the patterned thin film; and
processing the semiconductor substrate according to the patterned organic underlayer film.

16. A method for producing a semiconductor device, comprising:
forming an organic underlayer film on a semiconductor substrate;
applying the thin film forming composition as claimed in claim 1 onto the organic underlayer film and baking the composition to form a thin film;
applying an organic resist underlayer film forming composition onto the thin film to form an organic resist underlayer film;
applying a composition for a resist onto the organic resist underlayer film to form a resist film;
exposing the resist film to light;
developing the resist film after the exposure to obtain a resist pattern;
etching the organic resist underlayer film according to the resist pattern;
etching the thin film according to the patterned organic resist underlayer film;
etching the organic underlayer film according to the patterned thin film; and
processing the semiconductor substrate according to the patterned organic underlayer film.

17. A method for producing a semiconductor device, comprising:
forming a resist pattern on a substrate;
applying the thin film forming composition as claimed in claim 1 onto the substrate on which the resist pattern is formed and baking the composition to form a thin film;
etching the thin film to expose the resist surface; and
etching the resist pattern to reverse the pattern.

18. A method for producing a semiconductor device, comprising:
applying a composition for an EUV resist onto a semiconductor substrate and baking the composition to form an EUV resist film;
applying the thin film forming composition as claimed in claim 1 onto the EUV resist film to form a thin film;
exposing the thin film to EUV;
developing the EUV resist after the exposure to obtain a resist pattern; and
processing the semiconductor substrate according to the resist pattern.

* * * * *